United States Patent
Mizuguchi et al.

(10) Patent No.: US 9,202,560 B2
(45) Date of Patent: Dec. 1, 2015

(54) MEMORY ELEMENT AND MEMORY DEVICE WITH ION SOURCE LAYER AND RESISTANCE CHANGE LAYER

(75) Inventors: Tetsuya Mizuguchi, Kanagawa (JP); Kazuhiro Ohba, Miyagi (JP); Shuichiro Yasuda, Kanagawa (JP); Masayuki Shimuta, Kanagawa (JP); Akira Kouchiyama, Kanagawa (JP); Hiroaki Sei, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 634 days.

(21) Appl. No.: 13/403,560

(22) Filed: Feb. 23, 2012

(65) Prior Publication Data

US 2012/0294063 A1 Nov. 22, 2012

(30) Foreign Application Priority Data

Mar. 4, 2011 (JP) ................. 2011-048376

(51) Int. Cl.
- *H01L 23/52* (2006.01)
- *G11C 11/00* (2006.01)
- *G11C 13/00* (2006.01)

(Continued)

(52) U.S. Cl.
CPC ........ *G11C 13/0011* (2013.01); *H01L 27/2436* (2013.01); *H01L 27/2472* (2013.01); *H01L 45/085* (2013.01); *H01L 45/1233* (2013.01); *H01L 45/1266* (2013.01); *H01L 45/141* (2013.01); *H01L 45/144* (2013.01); *H01L 45/146* (2013.01); *G11C 2213/56* (2013.01)

(58) Field of Classification Search
CPC ................ H01L 45/141–45/144; H01L 45/04; H01L 45/08; H01L 45/085; H01L 45/1266; H01L 45/06; H01L 45/065

USPC .......... 257/529, E45.002; 365/100, 148, 163
See application file for complete search history.

(56) References Cited

U.S. PATENT DOCUMENTS 8,547,735 B2 * 10/2013 Mizuguchi et al. ........... 365/163
2008/0084653 A1 4/2008 Pinnow
(Continued)

FOREIGN PATENT DOCUMENTS

| JP | 2009-043757 | 2/2009 |
|----|-------------|--------|
| JP | 2009-043905 | 2/2009 |

(Continued)

OTHER PUBLICATIONS

PMC Suitable for Multilayering of Cells; Nikkei Electronics; Jan. 20, 2003; pp. 104.

(Continued)

*Primary Examiner* — Jesse Y Miyoshi
(74) *Attorney, Agent, or Firm* — Dentons US LLP

(57) ABSTRACT

There are provided a memory element and a memory device excellently operating at a low current, and having the satisfactory retention characteristics. The memory element includes a first electrode, a memory layer, and a second electrode in this order. The memory layer includes a resistance change layer disposed on the first electrode side, and being in a single- or multi-layer structure including a layer containing a highest percentage of tellurium (Te) as an anionic component, and an ion source layer disposed on the second electrode side, and containing a metallic element and one or more chalcogen elements including tellurium (Te), sulfur (S), and selenium (Se) with aluminum (Al) of 27.7 atomic % or more but 47.4 atomic % or less.

11 Claims, 13 Drawing Sheets

(51) Int. Cl.
*H01L 45/00* (2006.01)
*H01L 27/24* (2006.01)

(56) References Cited

U.S. PATENT DOCUMENTS

| | | |
|---|---|---|
| 2009/0290407 A1 | 11/2009 | Mouli |
| 2010/0117051 A1 | 5/2010 | Tian et al. |
| 2010/0193758 A1 | 8/2010 | Tian et al. |
| 2010/0195371 A1* | 8/2010 | Ohba et al. ............. 365/148 |
| 2011/0155987 A1 | 6/2011 | Mizuguchi et al. |
| 2011/0155988 A1 | 6/2011 | Mizuguchi et al. |
| 2011/0175049 A1 | 7/2011 | Yasuda et al. |

FOREIGN PATENT DOCUMENTS

| | | | |
|---|---|---|---|
| JP | 2010-062247 | | 3/2010 |
| JP | 2010062247 | * | 3/2010 |
| WO | 2010-026924 | | 3/2010 |
| WO | 2010026923 | | 3/2010 |

OTHER PUBLICATIONS

Extended European Search Report for EP application No. 12000686.1 dated Mar. 13, 2013.

Japanese Office Examination Report issued in connection with related Japanese Patent Application No. JP2011-048376 dated Sep. 9, 2014.

* cited by examiner

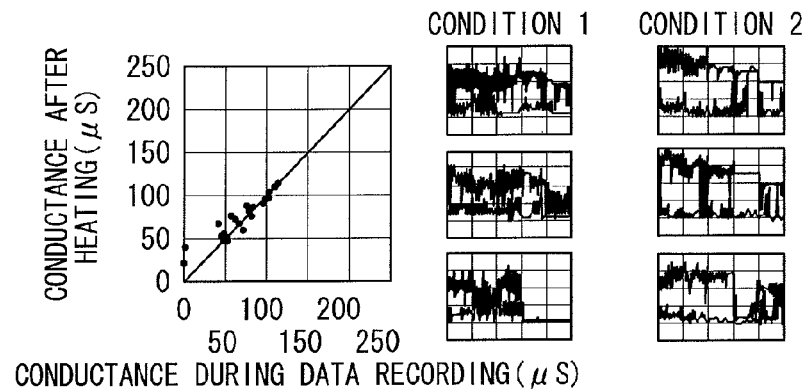
FIG. 5A SAMPLE 1-8
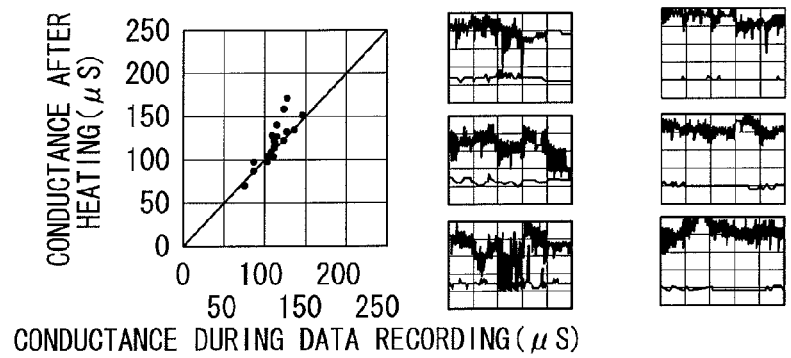
FIG. 5B SAMPLE 1-9
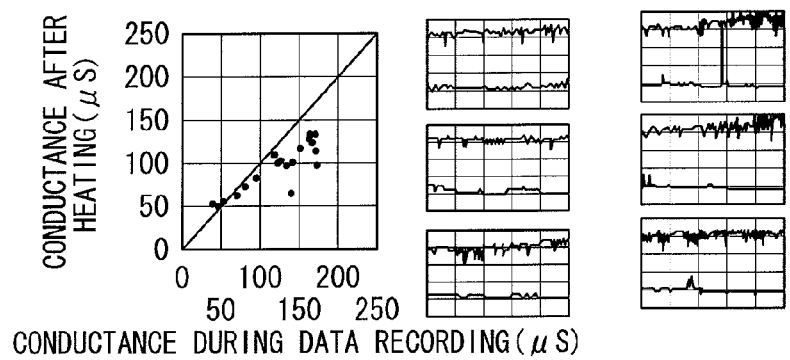
FIG. 5C SAMPLE 1-58
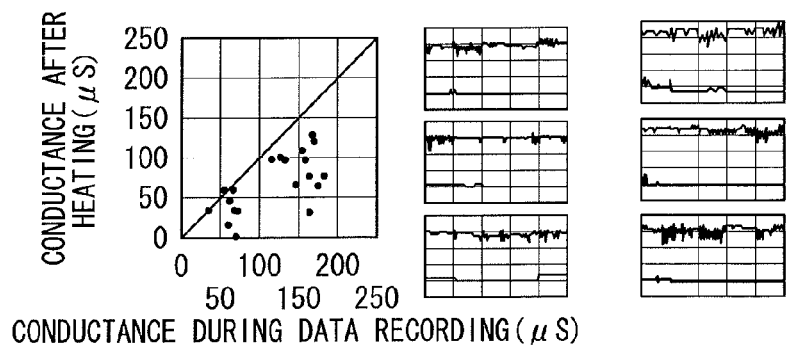
FIG. 5D SAMPLE 1-59

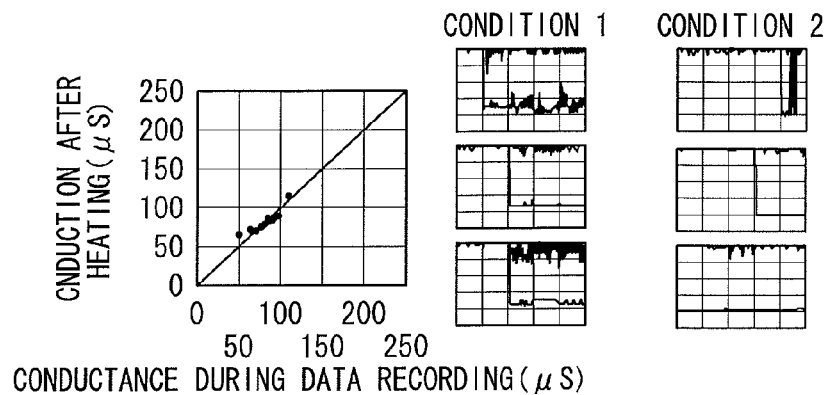
FIG. 6A SAMPLE 1-10
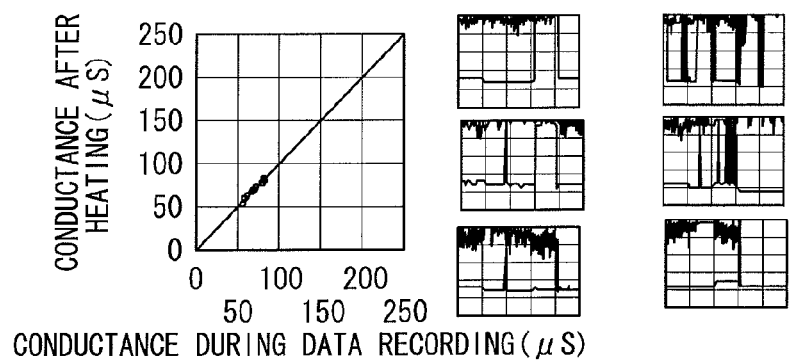
FIG. 6B SAMPLE 1-15
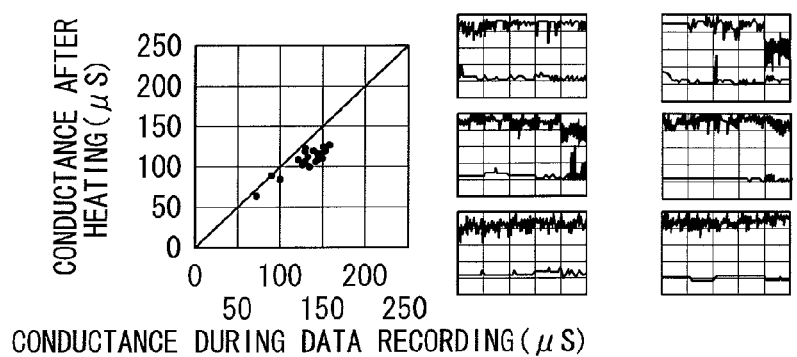
FIG. 6C SAMPLE 1-48
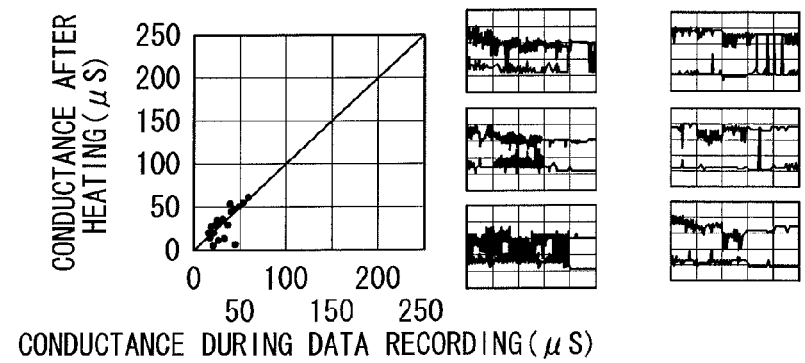
FIG. 6D SAMPLE 1-61

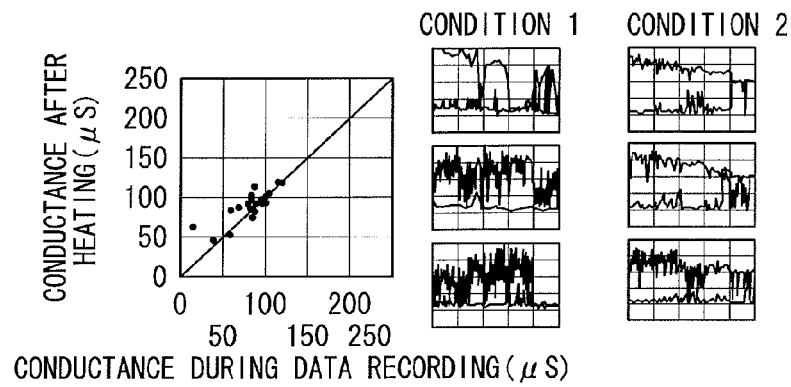
FIG. 7A SAMPLE 1-11
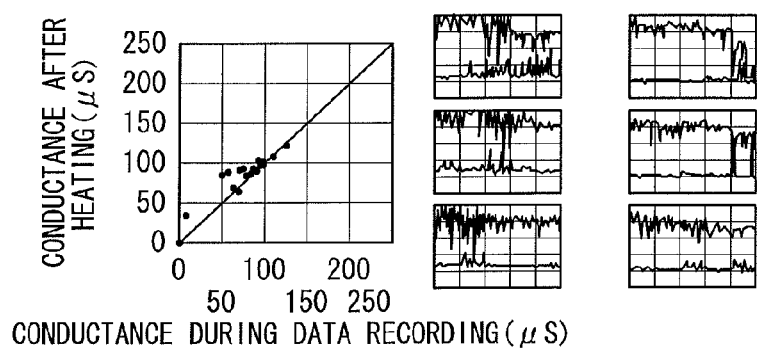
FIG. 7B SAMPLE 1-12
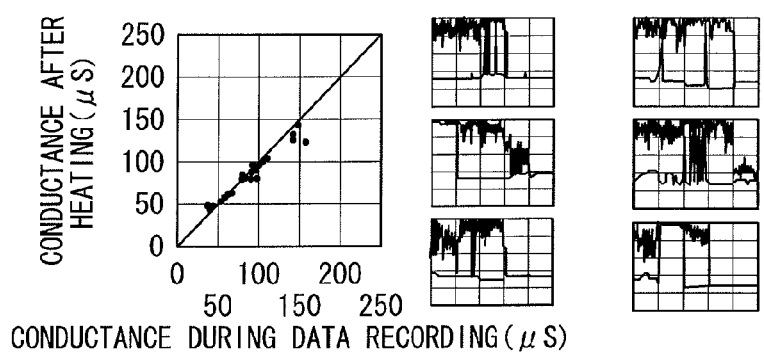
FIG. 7C SAMPLE 1-36
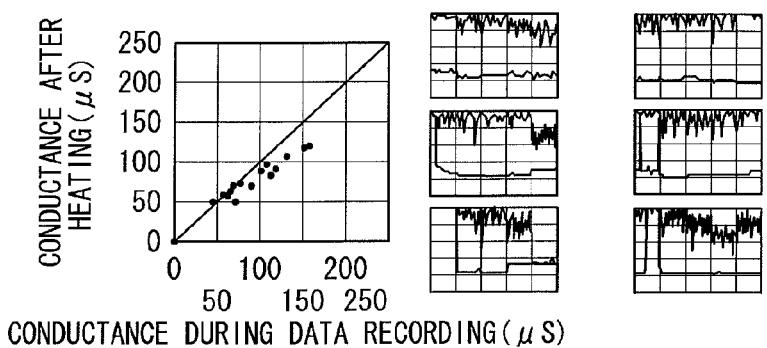
FIG. 7D SAMPLE 1-42

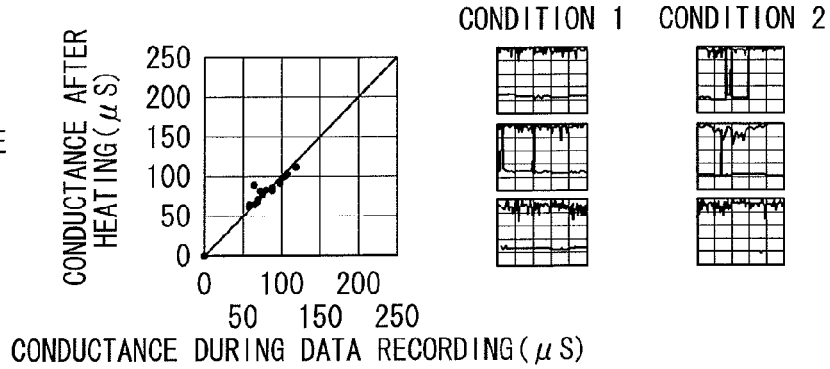
FIG. 9A SAMPLE 2-1
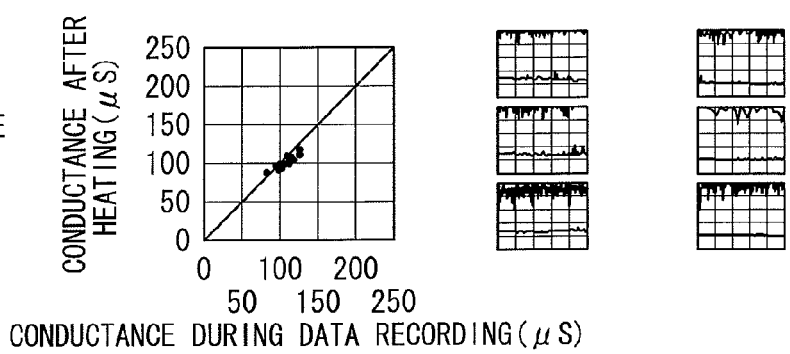
FIG. 9B SAMPLE 2-2
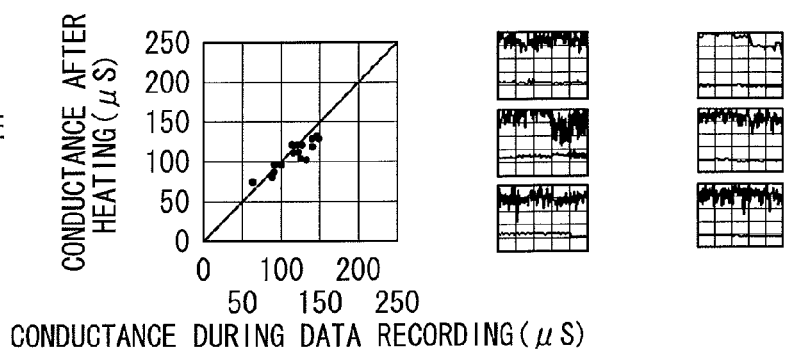
FIG. 9C SAMPLE 2-3
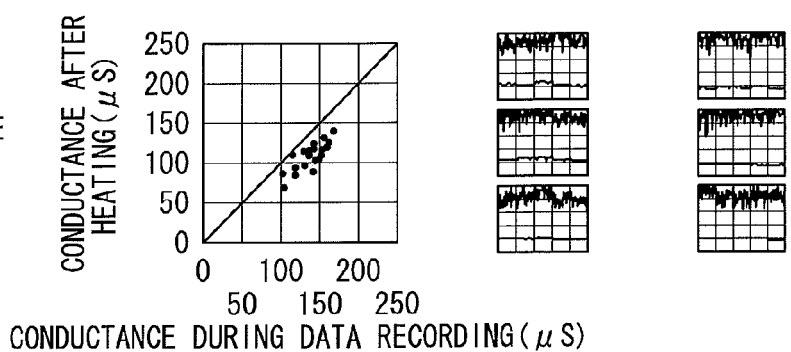
FIG. 9D SAMPLE 2-4

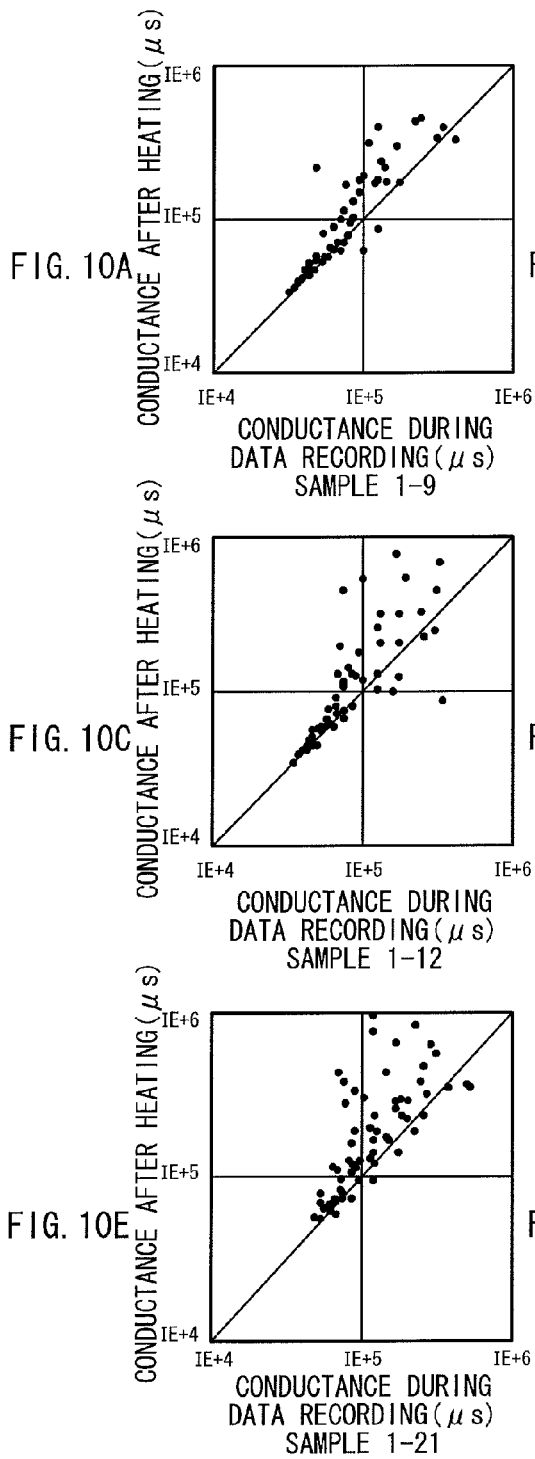
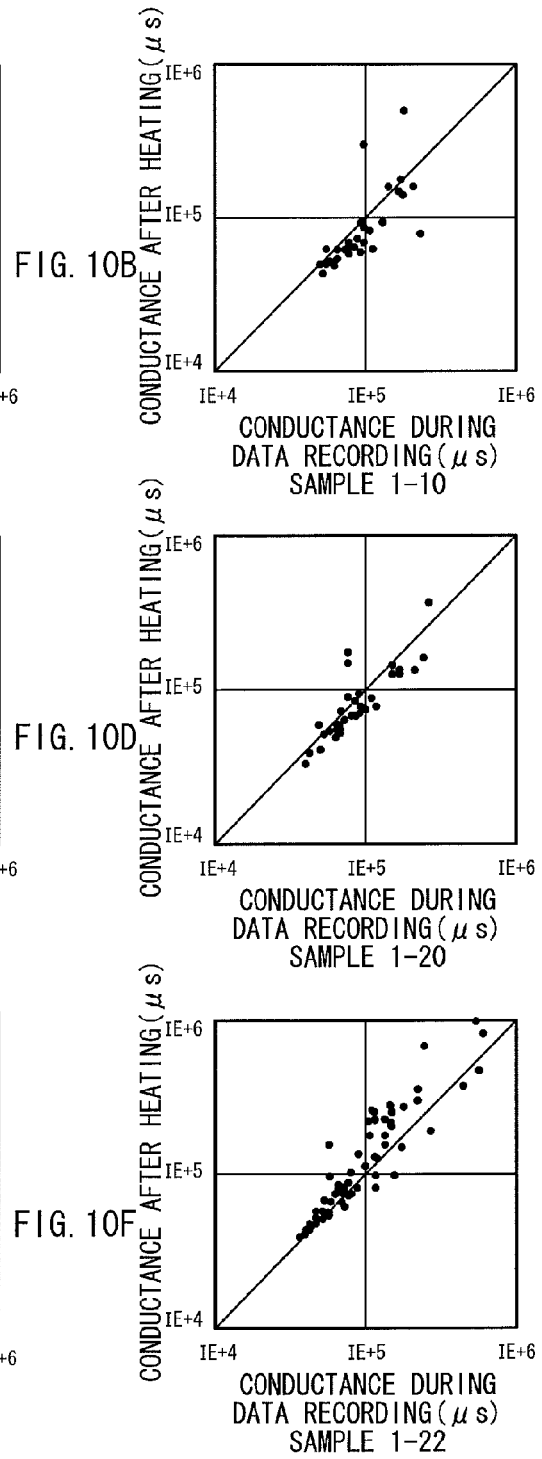

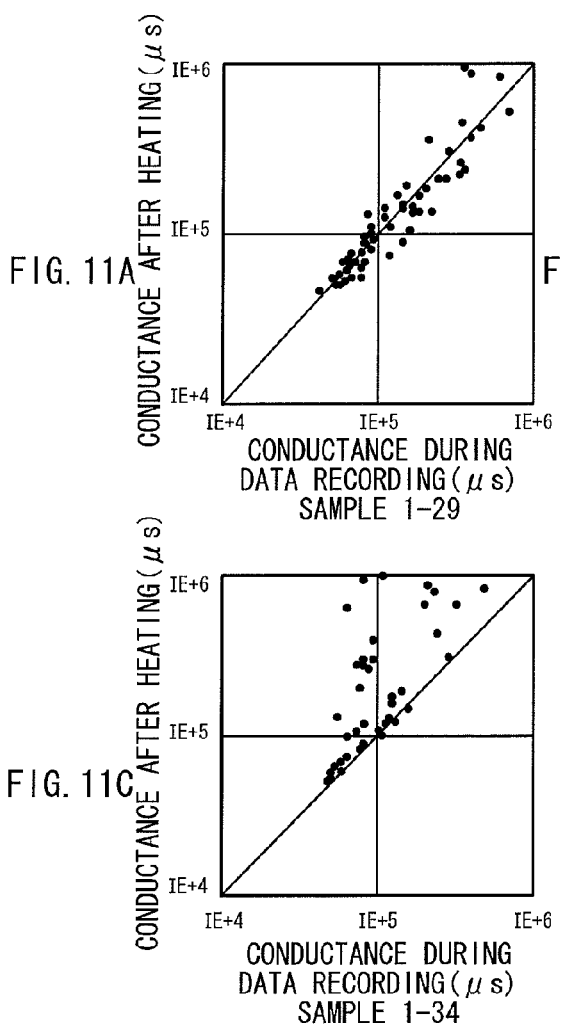

FIG. 13A  SAMPLE 3-1
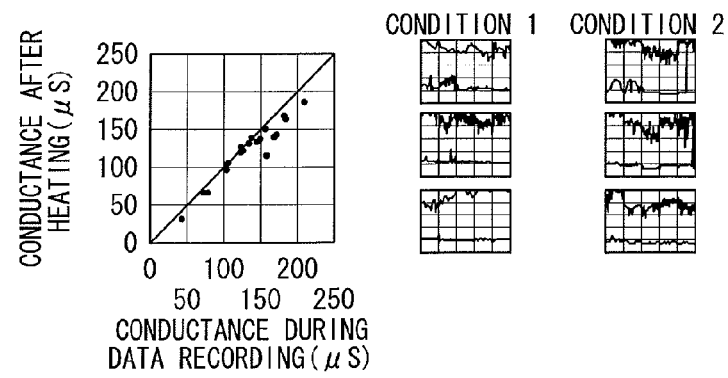
FIG 13B  SAMPLE 3-2
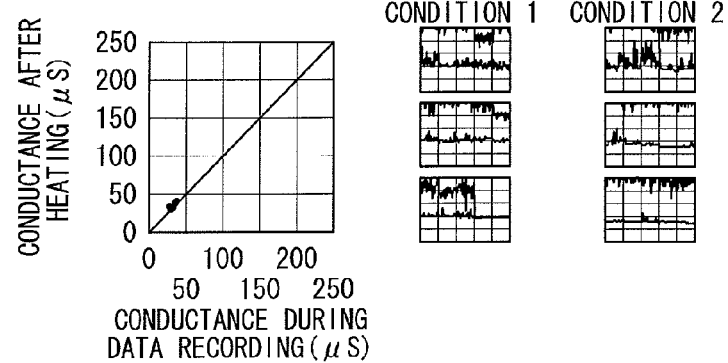

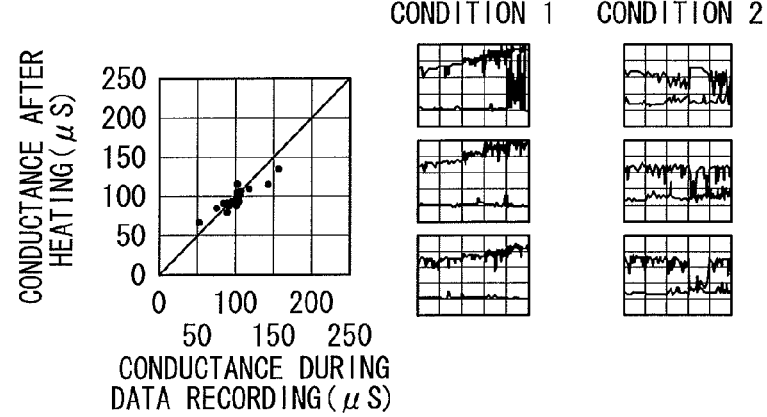
FIG. 14A SAMPLE 4-1
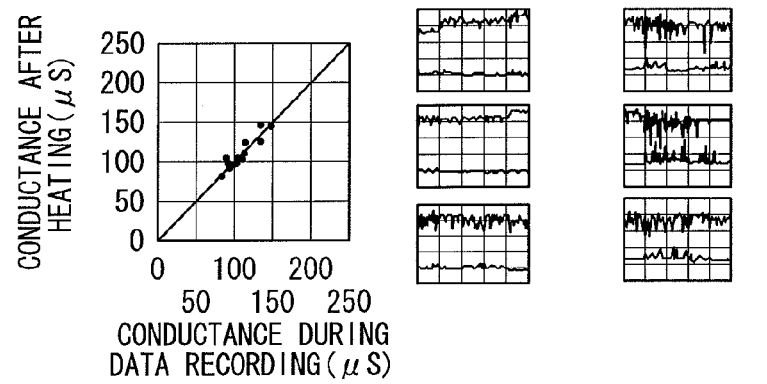
FIG. 14B SAMPLE 4-2
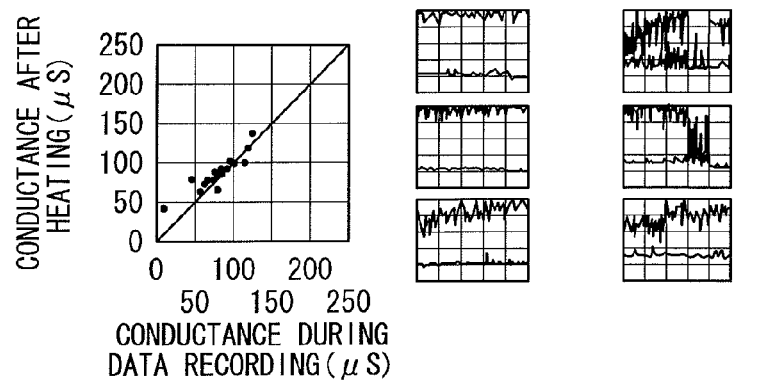
FIG. 14C SAMPLE 4-3

MEMORY ELEMENT AND MEMORY DEVICE WITH ION SOURCE LAYER AND RESISTANCE CHANGE LAYER

BACKGROUND

The present disclosure relates to a memory element and a memory device which store information based on any change of electrical characteristics observed in a memory layer including an ion source layer and a resistance change layer.

SUMMARY

As a nonvolatile memory from which information is not erased even if power is turned off, previously proposed are a flash memory, an FeRAM (Ferroelectric Random Access Memory), an MRAM (Magnetoresistive Random Access Memory), and others. Such types of memories are able to keep any written information for a long time with no supply of power. However, such types of memories each have advantages and disadvantages. Specifically, the flash memory is indeed high in packaging density, but is disadvantageous in terms of operation speed. The FeRAM has the limitations for microfabricating to achieve a higher packaging density, and also has an issue in a manufacturing process. The MRAM has an issue of power consumption.

In consideration thereof, proposed is a memory element of a new type being advantageous considering the limitations of microfabricating of the existing memory elements as above. This memory element is in the configuration in which two electrodes sandwich therebetween an ion conductor containing specific metal. With such a memory element, one of the two electrodes is configured to contain the metal same as that contained in the ion conductor. This allows, at the time of voltage application between the two electrodes, the metal in the electrode as ions in the electrode is dispersed into the ion conductor, thereby changing the resistance value of the ion conductor or the electrical characteristics such as capacitance. As an example, Japanese Unexamined Patent Application Publication (Published Japanese Translation of PCT application) No. 2002-536840 and Non-patent Literature 1 (Nikkei Electronics, Jan. 20 issue in 2003 (pp. 104) each describe the configuration of a memory device utilizing such characteristics. Especially Japanese Unexamined Patent Application Publication (Published Japanese Translation of PCT application) No. 2002-536840 proposes to configure an ion conductor by a solid solution of chalcogen element and metal. To be specific, the ion conductor is made of a material being a solid solution of AsS, GeS, GeSe together with Ag, Cu, and Zn, and one of two electrodes contains Ag, Cu, and Zn.

With the memory element configured as described above, however, when the ion conductor is left for a long time in the state of storage with a resistance value thereof being low (e.g., "1") or in the state of erasing with a resistance value thereof being high (e.g., "0"), or when the ion conductor is left as it is in the atmosphere at the temperature higher than the room temperature, there is an issue of failing in information retention because the resistance value shows a change. If the performance capabilities of information retention (characteristics of resistance value retention) are low as such, such element characteristics are not considered good enough for use in a nonvolatile memory.

For storing a change of resistance value as data observed in a memory element after erasing of any recorded information, proposed is the memory element in the structure of "lower electrode/GdOx/CuZrTeAlGe/upper electrode", for example (for example, see Japanese Unexamined Patent Application Publication No. 2009-43757). However, with such a memory element using GdOx to the layer causing a resistance change, the operation to erase any recorded information needs a relatively high level of voltage. Moreover, the memory element is expected to be improved more in terms of retention characteristics because the resistance value after erasing of any recorded information shows a large variation, for example.

On the other hand, in Japanese Unexamined Patent Application Publication No. 2010-62247, for example, proposed for solving the issues above is a memory element including a layer containing a chalcogen element in a layer causing a change of resistance. However, such a memory element does not yet produce sufficient effect, and the operating voltage is expected to be reduced more, and the resistance value after erasing of recorded information is expected to be improved in terms of retention characteristics.

It is thus desirable to provide a memory element and a memory device excellently operating at a low current, and having the satisfactory retention characteristics.

A memory element according to an embodiment of the present disclosure includes a first electrode, a memory layer, and a second electrode in this order. The memory layer includes a resistance change layer, and an ion source layer. The resistance change layer is disposed on the first electrode side, and is in a single- or multi-layer structure including a layer containing a highest percentage of tellurium (Te) as an anionic component. The ion source layer is disposed on the second electrode side, and contains a metallic element, and at least one of chalcogen elements including tellurium (Te), sulfur (S), and selenium (Se) with aluminum (Al) of 27.7 atomic % or more but 47.4 atomic % or less.

A memory device according to another embodiment of the present disclosure includes a plurality of memory elements each including a first electrode, a memory layer, and a second electrode in this order, and a pulse application unit applying a voltage or current pulse selectively to the memory elements. In the memory device, the memory elements are each the memory element according to the embodiment of the present disclosure.

With the memory element (memory device) according to the embodiments of the present disclosure, when voltage or current pulses of "positive direction" (e.g., the first electrode side is at a negative potential, and the second electrode side is at a positive potential) are applied with respect to the element in the initial state (high-resistance state), any metallic element contained in the ion source layer is ionized and diffused in the resistance change layer, and then is deposited by bonding with electrons at the first electrode, or remains in the resistance change layer and forms an impurity level. As a result, a low-resistance section (conductive path) containing the metallic element is formed in the memory layer, thereby decreasing the resistance of the resistance change layer (state of recording). When voltage pulses of "negative direction" (e.g., the first electrode side is at a positive potential, and the second electrode side is at a negative potential) are applied with respect to the element in the low-resistance state as such, the metallic element that has been deposited on the first electrode is ionized, and then is dissolved into the ion source layer. As a result, the conductive path containing the metallic element disappears, and the resistance change layer is increased in resistance (initial state or state of erasing).

Herein, by using Te to the resistance change layer, the metallic element that has been deposited in the resistance change layer at the time of erasing is easily dissolved to the ion source layer. Moreover, by using Al into the ion source layer, a high-resistance layer such as oxide film of Al is formed on the anode electrode at the time of erasing so that the high-resistance state after erasing remains as it is. Moreover, with the ion source layer containing Al of 27.7 atomic % or more but 47.4 atomic % or less, the mobility of Al (or Al ions) is adjusted in the ion source layer and in the resistance change layer.

With the memory element or the memory device according to the embodiment of the present disclosure, the resistance change layer contains Te. This accordingly makes a metallic element easy to dissolve into the ion source layer at the time of erasing, thereby allowing decrease of a voltage at the time of erasing data. Further, since the ion source layer contains Al, a high-resistance layer such as oxide film of Al is formed on the anode possibly remains as it is at the time of erasing. Still further, since the ion source layer contains Al of 27.7 atomic % or more but 47.4 atomic % or less, the mobility of Al (or Al ions) is adjusted in the ion source layer and in the resistance change layer. As a result, the low-resistance state becomes stable at the time of writing, that is, the characteristics of data retention are favorably improved.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 5A to 5D are each a diagram showing the characteristics of data retention and those of repetition in Example 1.

FIGS. 6A to 6D are each a diagram showing the characteristics of data retention and those of repetition also in Example 1.

FIGS. 7A to 7D are each a diagram showing the characteristics of data retention and those of repetition also in Example 1.

FIGS. 9A to 9D are each a diagram showing the characteristics of data retention and those of repetition in Example 2.

FIGS. 10A to 10F are each a diagram showing the characteristics of data retention in Example 3.

FIGS. 11A to 11C are each a diagram showing the characteristics of data retention also in Example 3.

FIGS. 13A and 13B are each a diagram showing the characteristics of data retention and those of repetition in Example 4.

FIGS. 14A to 14C are each a diagram showing the characteristics of data retention and those of repetition in Example 5.

DETAILED DESCRIPTION OF THE PREFERRED EMBODIMENT

In the below, an embodiment of the present disclosure is described in the following order by referring to the accompanying drawings.
(Embodiment)
1. Memory Element (Memory element in which a resistance change layer is in the single-layer structure)
2. Memory Device
(Modification)
(Memory element in which a resistance change layer is in the two-layer structure)
(Examples)

Embodiment

Memory Element

Figure 1:
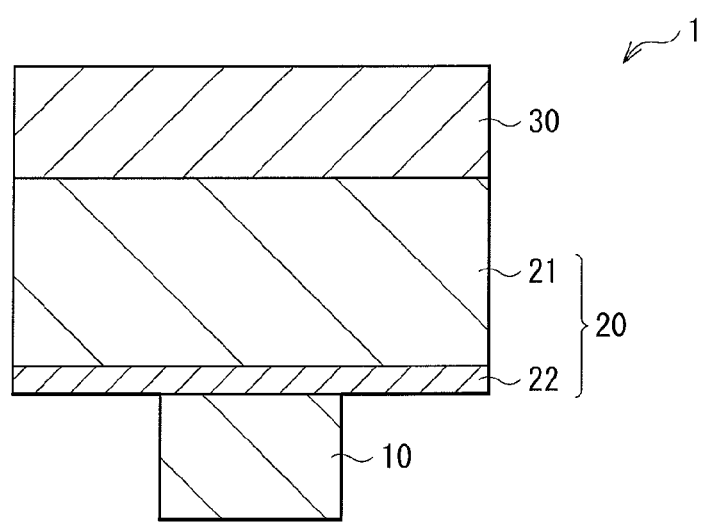
FIG. 1 is a cross-sectional view of a memory element in an embodiment of the present disclosure, showing the configuration thereof.

FIG. 1 is a cross-sectional view of a memory element 1 in an embodiment of the present disclosure, showing the configuration thereof. This memory element 1 is configured to include a lower electrode 10 (first electrode), a memory layer 20, and an upper electrode 30 (second electrode) in this order.

The lower electrode 10 is provided on a silicon substrate 41 formed with a CMOS (Complementary Metal Oxide Semiconductor) circuit as will be described later (FIG. 2), for example, thereby serving as a connection section with the portion of the CMOS circuit. This lower electrode 10 is made of a material for wiring use in the semiconductor process, e.g., tungsten (W), tungsten nitride (WN), copper (Cu), aluminum (Al), molybdenum (Mo), tantalum (Ta), and silicide. When the lower electrode 10 is made of a material such as Cu that possibly causes ion conduction in an electric field, the surface of the lower electrode 10 made of Cu or others as such may be covered with a material that hardly causes ion conduction or thermal diffusion, e.g., W, WN, titanium nitride (TiN), and tantalum nitride (TaN). When an ion source layer 21 that will be described later contains Al, preferably used is a metal film containing one or more of chromium (Cr), W, cobalt (Co), Si, gold (Au), palladium (Pd), Mo, iridium (Ir), titanium (Ti), and others that are more resistant to ionization than Al, or an oxide or nitride film thereof.

The memory layer 20 is configured by the ion source layer 21, and a resistance change layer 22. The ion source layer 21 contains an element to be converted into movable ions (cations and anions) that diffuse to the resistance change layer 22. The element that is possibly cationized includes one or two or more of metallic elements such as Al, Cu, germanium (Ge), Zn, and others. An ion conductive material that is to be anionized includes one or more of chalcogen elements including tellurium (Te), sulfur (S), and selenium (Se), for example. The ion source layer 21 is disposed on the upper electrode 30 side, and in this example, is in contact with the upper electrode 30. The metallic element(s) and the chalcogen element(s) are bonded together, thereby forming a metal chalcogenide layer. This metal chalcogenide layer is mainly in the amorphous structure, and serves as an ion supply source.

As for the metallic element that is possibly cationized, as is reduced on the cathode electrode during the operation of writing and forms a conductive path (filament) in the form of metal, any element chemically stable is preferable, i.e., possibly remains in the form of metal in the ion source layer 21 containing the chalcogen element(s) described above. Such a metallic element includes, in addition to those described above, transition metals of groups 4A, 5A, and 6A in the periodic table, i.e., Ti, zirconium (Zr), hafnium (Hf), vanadium (V), niobium (Nb), Ta, Cr, Mo, and W, for example. Among these elements, one or two or more are possibly used. Alternatively, silver (Ag) and Si or others may be used as additive elements to the ion source layer 21.

The specific composition of the ion source layer 21 as such contains ZrTeAl, TiTeAl, CrTeAl, WTeAl, TaTeAl, and others. Such specific materials may also include CuZrTeAl being a result of addition of Cu to ZrTeAl, and preferably used is CuZrTeAlGe being a result of another addition of Ge to CuZrTeAl. Moreover, with an addition of the additive element described above, CuZrTeAlGe may be used.

In the ion source layer with the composition as such, the content of each of the elements are preferably in the following range. That is, the content of Al is preferably in the range of 27.7 atomic % to 47.4 atomic % both inclusive. The total content of Cu and Zr is preferably in the range of 23.6 atomic % to 39.4 atomic % both inclusive. The content of chalcogen element is preferably in the range of 20.7 atomic % to 42.7 atomic % both inclusive. If also with an addition of Ge, the content thereof is preferably 15 atomic % or less. With such a configuration, each of the component elements may serve fully to its maximum degree. The details thereof will be described later.

Herein, the metallic element in the ion source layer 21 is surely not restrictive to those described above, and another option may be ZrTeMg including Mg as an alternative to Al. As for the ionizing metallic element, any similar additive element is possibly used even if a transition metallic element selected for use is not Zr but Ti or Ta, e.g., possibly TaTeAlGe. Moreover, as for the ion conductive material, Te is surely not restrictive, and sulfur (S), selenium (Se), or iodine (I) may be also used, i.e., specifically ZrSAl, ZrSeAl, ZrIAl, CuGeTeAl, and others. Note that Al is not necessarily contained, and CuGeTeZr or others may be also used.

Note that the ion source layer 21 may be added with any other elements for the purpose of preventing peeling of film during a high-temperature heat treatment for the memory layer 20, for example. Silicon (Si) is an exemplary additive element that possibly offers also the improvement of the retention characteristics, and is preferably added to the ion source layer 21 together with Zr. Incidentally, if the content of Si for addition is not enough, the effect of preventing the film peeling is not sufficiently produced, and if the content thereof is too much, the resulting memory operation characteristics are not satisfactory enough. In consideration thereof, the content of Si in the ion source layer 21 is preferably in the range of about 10 to 45 atomic % to produce the effect of preventing film peeling, and to have the satisfactory memory operation characteristics.

Moreover, by using any metallic element (M) that is more likely to react with Te in the resistance change layer 22 that will be described later, the resulting ion source layer 21 may be in the layered structure of Te/Ion Source Layer (containing the metallic element M). If this is the structure, with a heat treatment after the film formation, the resulting structure is stabilized as MTe/Ion Source Layer 21. The element more likely to react with Te is exemplified by Al, magnesium (Mg), and others.

The resistance change layer 22 is disposed on the lower electrode 10 side, and in this example, is in contact with the lower electrode 10. This resistance change layer 22 serves as a barrier against electric conduction. The resistance change layer 22 shows a change of resistance value when a predetermined level of voltage is applied between the lower and upper electrodes 10 and 30. In this embodiment, this resistance change layer 22 is made of a compound mainly containing Te that behaves as an anionic component. Such a compound is exemplified by AlTe, MgTe, or ZnTe.

The resistance change layer 22 preferably has the initial resistance value of 1 MΩ or larger. Considering as such, the resistance value in the state of low resistance is preferably several hundred kΩ or smaller. For reading at a high speed the state of resistance of any microfabricated resistance change memory, the resistance value in the state of low resistance is preferably as low as possible. However, since the resistance value is 40 to 100 kΩ when writing is performed under the conditions of 20 to 50 μA and 2 V, the memory is supposed to have the initial resistance value higher than that value. Allowing for the one-digit width of resistance separation, the resistance value described above is considered appropriate. Note here that the resistance change layer 22 may be made not only of the above-described material containing Te but also of any previously-used oxide such as GaOx and AlOx.

The upper electrode 30 may be made of a material similar to that of the lower electrode 10, i.e., a well-known material for use of semiconductor wiring, and preferably, be made of a stable material not reacting with the ion source layer 21 even after post-annealing.

With such a memory element 1 of the embodiment, when a voltage or current pulse is applied by a power supply circuit (pulse application unit; not shown) via the lower and upper electrodes 10 and 30, the memory layer 20 shows a change of the electrical characteristics thereof, e.g., change of the resistance value thereof, thereby performing information writing, erasing, and reading. In the below, such an operation is described specifically.

First of all, a positive voltage is applied to the memory element 1 such that the upper electrode 30 is at a positive potential, and the lower electrode 10 side is at a negative potential, for example. In response thereto, any metallic element in the ion source layer 21 is ionized and diffused to the resistance change layer 22, and then is deposited by bonding with electrons on the lower electrode 10 side. As a result, a filament is formed on the interface between the lower electrode 10 and the memory layer 20. This filament is made of a low-resistance metallic element reduced in the form of metal. Alternatively, the ionized metallic element remains in the resistance change layer 22, and forms an impurity level. As a result, a filament is formed in the resistance change layer 22, and this accordingly decreases the resistance value of the memory layer 20, i.e., the memory layer 20 shows a decrease of resistance value to be lower (to be in the low-resistance state) than that in the initial state (in the high-resistance state).

Thereafter, even if the memory element 1 becomes free of voltage by stopping the application of the positive voltage thereto, the state of low resistance remains as it is. This means information writing is done. For use in a once-writable memory device, i.e., a so-called PROM (Programmable Read Only Memory), the memory element 1 is completed with recording only by the process of recording described above. On the other hand, for application use in an erasable memory device, i.e., RAM (Random Access Memory), EEPROM (Electronically Erasable and Programmable Read Only Memory), or others, a process of erasing is necessary. During the process of erasing, a negative voltage is applied to the memory element 1 such that the upper electrode 30 is at a negative potential, and the lower electrode 10 side is at a positive potential, for example. In response thereto, in the filament formed inside of the memory layer 20, the metallic element is ionized, and then is dissolved into the ion source layer 21 or is bonded with Te or others, thereby forming a compound such as $Cu_2Te$ or CuTe. As a result, the filament made of the metallic element disappears or is decreased in area, and the resistance value thus shows an increase.

Thereafter, even if the memory element 1 becomes free of voltage by stopping the application of the negative voltage thereto, the resistance value therein remains high. This allows erasing of any information written thereto. By repeating such a procedure, the memory element 1 is to be subjected to repeated writing of information and erasing of the written information.

If the state high in resistance value is correlated with information of "0", and if the state low in resistance value is correlated with information of "1", for example, the information of "0" is to be changed to the information of "1" in the process of information recording by the application of a positive voltage, and the information of "1" is to be changed to the information of "0" in the process of information erasing by the application of a negative voltage. Note that, in this example, although the operation of decreasing the resistance of the memory element is correlated with the writing operation and the operation of increasing the resistance thereof is correlated with the erasing operation, the correlation may be inversed.

In this embodiment, the resistance change layer 22 is made of a compound mainly containing Te. Therefore, during the decrease of resistance of the resistance change layer 22, the metallic element diffused from the ion source layer 21 is stabilized in the resistance change layer 22 so that the resulting low-resistance state becomes easy to retain. Moreover, compared with oxides high in electronegativity and silicon compounds being covalent compounds, the binding force of Te with the metallic element is weaker, and thus the metallic element diffused inside of the resistance change layer 22 is easily moved to the ion source layer 21 by the application of an erasing voltage so that the erasing characteristics are improved. Note that, as for the electronegativity of the chalcogenide compounds, since the absolute values thereof are in the ascending order of tellurium<selenium<sulfur<oxygen, the effect of improvement is to be high with the lower content of oxygen in the resistance change layer 22, and with the use of any chalcogenide compound low in electronegativity.

Next, described are the reasons why the ion source layer 21 preferably contains Ze, Al, Ge, and others.

When the ion source layer 21 contains Zr, this Zr acts as an ionizing element together with the metallic element such as copper (Cu) described above so that the resulting filament is a mixture of Zr and the above-described metallic element such as Cu. Herein, Zr is supposed to be reduced on the cathode electrode during the operation of writing, and is supposed to form a filament in the form of metal in the low-resistance state after the writing. The filament formed as a result of reduction of Zr is relatively difficult to dissolve in the ion source layer 21 containing the chalcogenide element(s) such as S, Se, and Te. Therefore, once the state is put in writing, i.e., in the low-resistance state, the resulting low-resistance state is retained more easily than in the case with a filament containing only the above-described metallic element such as Cu. For example, Cu is formed as a filament by the operation of writing. However, Cu in the form of metal is dissolved easily in the ion source layer 21 containing the chalcogen element(s), and in the state of no application of a voltage pulse for writing, i.e., in the state of data retention, Cu is ionized again and the state is changed to high resistance. The resulting characteristics of data retention are not thus satisfactory. On the other hand, combining Zr with any appropriate content of Cu facilitates amorphization, and keeps uniform the microstructure of the ion source layer 21, thereby contributing to the improvement of the characteristics of resistance value retention.

Also for retention of the high-resistance state at the time of erasing, when the ion source layer 21 contains Zr, the following effect is to be produced. That is, when a filament to be formed contains Zr, and when Zr is dissolved in the ion source layer 21 again as ions, for example, due to the lower ion mobility of Zr at least than Cu, the Zr ions are resistant to move even if the temperature is increased, or even if they are left as they are for a long time. As such, Zr in the form of metal is not easily deposited on the cathode electrode, and thus remains high in resistance even if it is kept in the temperature higher than the room temperature or if it is left as it is for a long time.

Moreover, when the ion source layer 21 contains Al, if the upper electrode is biased to a negative potential as a result of the erasing operation, formed is an oxide film stable on the interface between the ion source layer 21 behaving like a solid-electrolyte and the anode electrode. This makes stable the high-resistance state (erasing state). This also contributes to the increase of the repetition frequency considering the self-reproduction of the resistance change layer. Herein, Al is surely not the only option, and Ge or others acting similar thereto may be also contained.

As such, when the ion source layer 21 contains Zr, Al, Ge, and others, compared with the previous memory element, the resulting memory element has the improved characteristics of wide-range resistance value retention, those of high-speed operation of writing and erasing, and those of low-current operation, and the increased repetition frequency. Moreover, if any resistance state intermediate between high and low is created through adjustment of an erasing voltage during a change of resistance from low to high, for example, the resulting intermediate state is to be retained with a good stability. Accordingly, the resulting memory is capable not only of binary storage but also of multilevel storage. Herein, such an intermediate state is possibly created also through adjustment of the amount of atoms deposited by changing a write current during a change of resistance from high to low.

Such various characteristics important for the operation of memory, i.e., the characteristics of operation of writing and erasing with voltage application, the characteristics of resistance value retention, and the repetition frequency of operation, vary depending on the addition content of Al, Zr, and Cu, and also Ge.

When the content of Al is too much, the Al ions become easy to move, thereby creating the state of writing by reduction of the Al ions. Since Al is not stable enough in the form of metal in the chalcogenide solid electrolyte, the characteristics of low-resistance writing state retention are degraded. On the other hand, when the content of Al is too little, the effect of improving the erasing operation itself or the characteristics of high-resistance region retention is impaired, thereby decreasing the repetition frequency. In consideration thereof, the content of Al in the ion source layer 21 is preferably 27.7 atomic % or more, and more preferably, 47.4 atomic % or less.

If the content of Zr is too much, for example, the resulting ion source layer 21 is decreased too much in resistance value, thereby failing in voltage application effectively to the ion source layer 21, or resulting in a difficulty in dissolving Zr in the chalcogenide layer. This especially causes a difficulty in erasing, and the threshold voltage for erasing is increased based on the addition content of Zr. If the content of Zr is all too much, this results in a difficulty also in writing, i.e., in decreasing of resistance. On the other hand, if the addition content of Zr is too little, the effect of improving the characteristics of wide-range resistance value retention as described above is impaired.

Although adding an appropriate content of Cu to the ion source layer 21 indeed facilitates amorphization, if the content thereof is too much, Cu in the form of metal degrades the characteristics of writing retention or adversely affects the speed of the writing operation as is not stable enough in the ion source layer 21 containing the chalcogen element(s). Whereas a combination of Zr and Cu produces the effect of making amorphous the ion source layer 21 with ease, and of keeping uniform the microstructure of the ion source layer 21. This accordingly prevents the material components in the ion source layer 21 from becoming not uniform by the repeated operation, thereby increasing the repetition frequency and improving the retention characteristics. When the content of Zr in the ion source layer is appropriate, the filament of metal zirconium (Zr) is supposed to remain as it is in the resistance change layer 22 even if the filament made of Cu is dissolved again into the ion source layer 21, and thus the state of low resistance remains as it is. As such, the characteristics of writing retention are not affected.

For the effect produced in combination of Zr and Cu as above, the total content of Zr and Cu in the ion source layer 21 is preferably in the range of 23.5 atomic % to 37 atomic % both inclusive. The content of only Zr in the ion source layer 21 is preferably 9 atomic % or more, and more preferably, is 18.5 atomic % or less.

Herein, Ge is not necessarily contained, but when Ge is to be added, the content thereof is preferably 15 atomic % or less considering that too much content of Ge degrades the characteristics of writing retention.

Note here that, virtually, the characteristics of the memory element 1 are dependent on the composition ratio between Zr and Te. Accordingly, the composition ratio between Zr and Te preferably falls within the following range.

Composition Ratio of Zr(Atomic %)/Composition Ratio of Te(Atomic %)=0.3 to 0.84

This is not necessarily evident, but since Cu has the degree of dissociation lower than that of Zr, and since the resistance value of the ion source layer 21 is determined by the composition ratio between Zr and Te, as long as the composition ratio between Zr and Te falls within the above-described range, the resistance value remains suitable. This thus seems because the bias voltage applied to the memory element 1 works effectively to the portion of the resistance change layer 22.

When the value does not fall within the range described above, e.g., when the equivalence ratio is too large, the balance between the cations and anions is lost, and thus among the existing metallic elements, any element not ionizing is increased in amount. Therefore, the filament generated by the operation of writing during the operation of erasing may not be eliminated efficiently. Similarly, when the anion element exists too much because the equivalence ratio is too small, the filament in the form of metal generated by the operation of writing is not inclined to remain in the form of metal. The characteristics of writing state retention thus seem to be degraded.

In the below, the manufacturing method of the memory element 1 in the embodiment is described.

First of all, on a substrate formed with a CMOS circuit such as selection transistor, the lower electrode 10 made of TiN is formed, for example. Thereafter, if necessary, any oxides or others on the surface of the lower electrode 10 are removed by reverse sputtering, for example. Next, the formation of layers is performed up to the upper electrode 30 including the resistance change layer 22, and the ion source layer 21 in succession through exchange of targets in a device for sputtering. The targets herein are those each with the composition adapted for the material of the corresponding layer. The diameter of the electrode is 50 to 300 nm$\phi$. A film of alloy is formed at the same time using a target of a component element.

After the formation of layers up to the upper electrode 30, a wiring layer (not shown) is formed for connection to the upper electrode 30, and a contact section is connected to achieve a common potential among all of the memory elements 1. Thereafter, the layered film is subjected to a post-annealing process. As such, the memory element 1 of FIG. 1 is completed.

In this memory element 1, as described above, a voltage is so applied that the upper electrode 30 is at a positive potential and the lower electrode 10 is at a negative potential, thereby forming a filament on the interface between the lower electrode 10 and the resistance change layer 22. This accordingly decreases the resistance value of the resistance change layer 22 so that writing is performed. Next, to each of the upper and lower electrodes 30 and 10, applied this time is a voltage whose polarity is opposite to that applied thereto for writing. In response thereto, the metallic element in the filament formed inside of the resistance change layer 22 is ionized again, and then is dissolved into the ion source layer 21. This accordingly increases the resistance value of the resistance change layer 22 so that erasing is performed.

In the memory element 1 in the embodiment, by using Te to the resistance change layer in which the binding force with the metallic element is relatively weaker, the filament is easily dissolved to the ion source layer in response to the application of an erasing voltage. Moreover, by using Al into the ion source layer, an oxide film is formed on the interface between the ion source layer 21 and the anode electrode during the operation of erasing. Since this oxide film is of self-reproduction type, the retention characteristics in the state of erasing, i.e., in the state of high resistance, are improved. Moreover, with the ion source layer 21 containing Al of 27.7 atomic % or more but 47.4 atomic % or less, the mobility of Al (or Al ions) is adjusted in the ion source layer 21 and in the resistance change layer 22.

As described above, with the memory element 1 in the embodiment, the resistance change layer 21 contains Te. This accordingly makes a filament easy to dissolve at the time of application of an erasing voltage, thereby allowing decrease of a current at the time of erasing data. Further, since the ion source layer 21 contains Al, an oxide film of Al is formed on the anode electrode at the time of erasing. Since this oxide film is of self-reproduction type, the element characteristics are prevented from being degraded by the repeated operation, thereby favorably improving the retention characteristics in the state of erasing. What is more, with the ion source layer 21 containing Al of 27.7 atomic % or more but 47.45 atomic % or less, the mobility of Al (or Al ions) is adjusted in the ion source layer 21 and in the resistance change layer 22. This accordingly improves the retention characteristics not only in the state of erasing but also in the state of writing. In other words, the operation is possibly performed at a low current, and the characteristics of repetition and those of data retention are improved.

Moreover, with the ion source layer 21 containing Cu, Zr, and Ge, the characteristics of data retention are improved to a further degree. Especially when the ion source layer 21 contains Al, Cu, Zr, and Ge as below, i.e., 27.7 atomic %$\leq$A$\leq$147.4 atomic %, 23.6 atomic %$\leq$Cu+Zr$\leq$39.4 atomic %, 20.7 atomic %$\leq$chalcogen element$\leq$42.7 atomic %, and 15 atomic % or less of Ge if added, even if the memory is microfabricated, and even if a transistor is reduced in current driving force for controlling the writing and erasing of the memory element 1, writing and erasing of data become possible. Moreover, the characteristics of data retention possibly remain satisfactory. In other words, by configuring a memory device using this memory element 1, the resulting memory device is possibly small in size with a high density.

(Memory Device)

By arranging a plurality of memory elements 1 described above in rows or in a matrix, for example, a memory device (memory) is possibly configured. At this time, as appropriate, the memory elements 1 may be each connected with a MOS transistor for element selection use or with a diode to configure a memory cell. The resulting memory cells may be then each connected to a sense amplifier, an address decoder, circuits of writing, erasing, and reading, and others by wiring.

Figure 2:
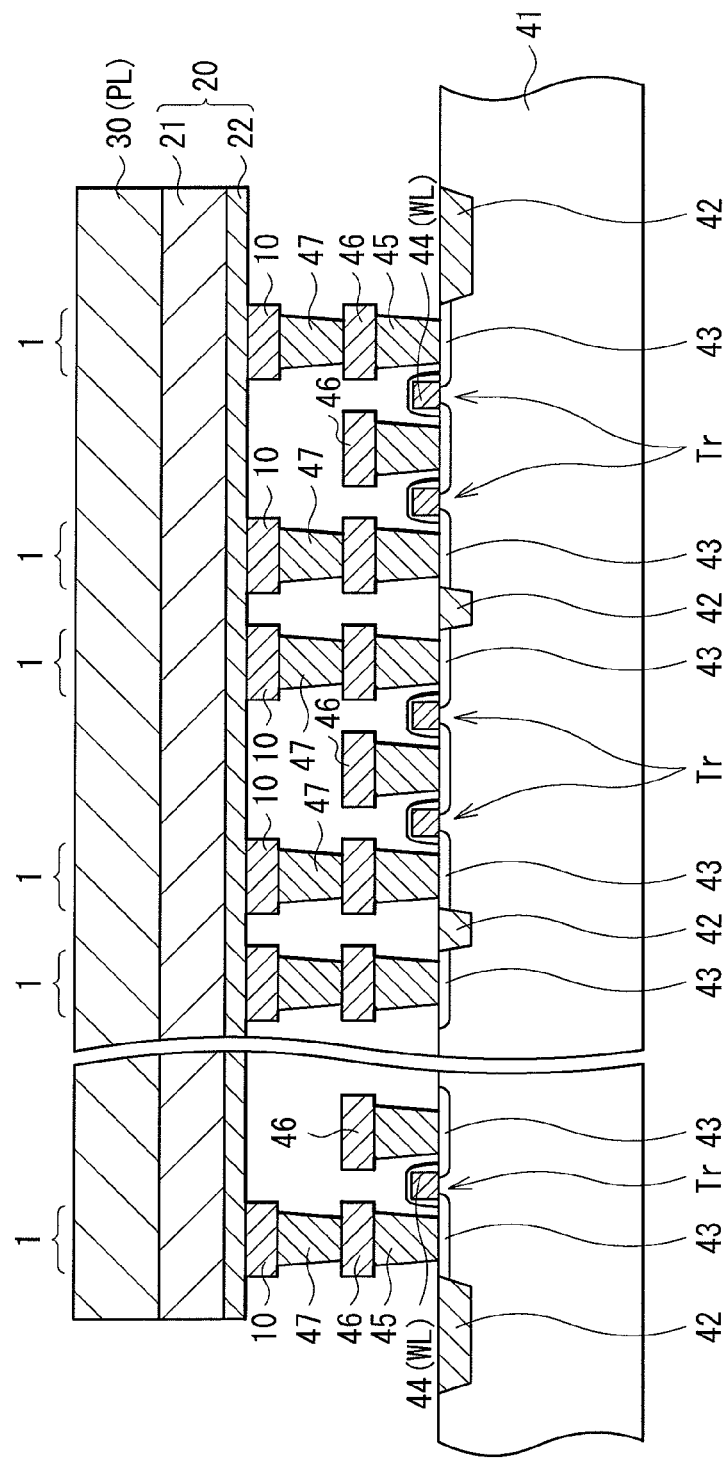
FIG. 2 is a cross-sectional view of a memory cell array using the memory element of FIG. 1, showing the configuration thereof.
Figure 3:
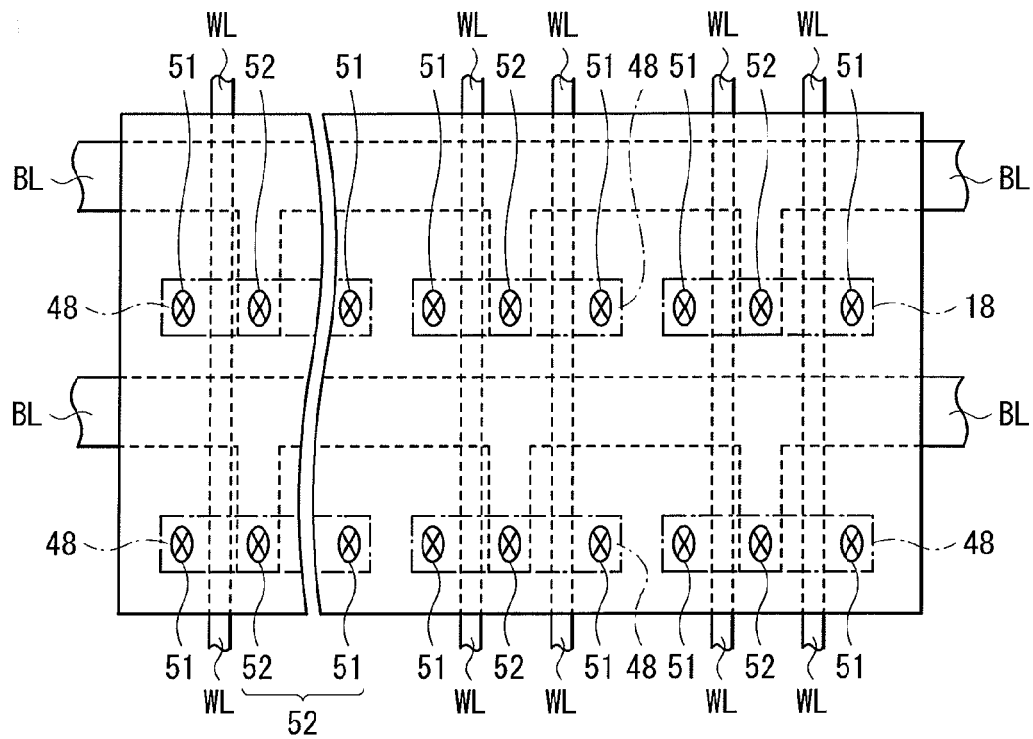
FIG. 3 is a plan view of the memory cell array of FIG. 2.

FIGS. 2 and 3 each show an exemplary memory device (memory cell array) including a large number of memory elements 1 arranged in a matrix. FIG. 2 shows the cross-sectional configuration of the memory cell array, and FIG. 3 shows the configuration thereof in a planar view. In this memory cell array, to each of the memory elements 1, wiring connected to the lower electrode 10 side thereof is so provided as to intersect wiring connected to the upper electrode 30 side thereof, and at the respective intersection points, the memory element 1 is disposed.

The memory elements 1 all share the layers, i.e., the resistance change layer 22, the ion source layer 21, and the upper electrode 30. In other words, these layers, i.e., the resistance change layer 22, the ion source layer 21, and the upper electrode 30, are each for the shared use by all of the memory elements 1 (are each one specific layer for use by all of the memory elements 1). The upper electrode 30 is a plate electrode PL for shared use by any adjacent cells.

On the other hand, the lower electrode 10 is provided individually to each of the memory cells so that the memory cells are electrically separated from one another. As such, the memory elements 1 in the memory cells are each defined by position corresponding to its lower electrode 10. The lower electrodes 10 are each connected to its corresponding MOS transistor Tr for cell selection use, and the memory elements 1 are each disposed above its corresponding MOS transistor Tr.

The MOS transistor Tr is configured by source/drain regions 43, and a gate electrode 44, which are formed in a region separated by an element separation layer 42 in the substrate 41. A side wall insulation layer is formed on the wall surface of the gate electrode 44. The gate electrode 44 serves also as a word line WL, which is one of two pieces of address wiring for the memory element 1. One of the source/drain regions 43 of the MOS transistor Tr is electrically connected to the lower electrode 10 of the memory element 1 via various layers, i.e., a plug layer 45, a metal wiring layer 46, and a plug layer 47. The other of the source/drain regions 43 of the MOS transistor Tr is connected to the metal wiring layer 46 via the plug layer 45. The metal wiring layer 46 is connected to a bit line BL (refer to FIG. 3), which is the remaining piece of address wiring for the memory element 1. Note that, in FIG. 3, an active region 48 of the MOS transistor Tr is indicated by alternate long and short dashed lines. In the active region 48, contact sections 51 are connected to the lower electrode 10 of the memory element 1, and a contact section 52 is connected to the bit line BL.

In such a memory cell array, when a voltage is applied to the bit lines BL with the gate of the MOS transistor Tr turned ON by the word line WL, the voltage is directed to the lower electrode 10 of the selected memory cell via the source/drain of the MOS transistor Tr. In this example, as for the voltage applied to the lower electrode 10, when the polarity thereof is at a negative potential compared with the potential of the upper electrode 30 (the plate electrode PL), the resistance value of the memory element 1 is changed in state to low resistance as described above, whereby the selected memory cell is written with information. Next, when the potential of the voltage applied this time to the lower electrode 10 is positive compared with the potential of the upper electrode 30 (the plate electrode PL), the resistance value of the memory element 1 is changed in state again to high resistance, whereby the information written to the selected memory cell is erased. For reading of the written information, for example, a selection of memory cell is made by the MOS transistor Tr, and with respect to the selected memory cell, a predetermined level of voltage or current is applied. The current or voltage varying in level based on the resistance state of the memory element 1 at this time is detected via a sense amplifier or others connected to the tip of the bit line BL or of the plate electrode PL. Herein, the voltage or current applied to the selected memory cell is set to be smaller than the threshold value of the voltage or others at which the memory element 1 shows a change of resistance value.

The memory device of this embodiment is applicable to various types of memory devices as described above. For example, the memory device is applicable for use with any types of memories such as once-writable PROM, electrically erasable EEPROM, or so-called RAM available for high-speed writing, erasing, and reproduction.

(Modification)

Figure 4:
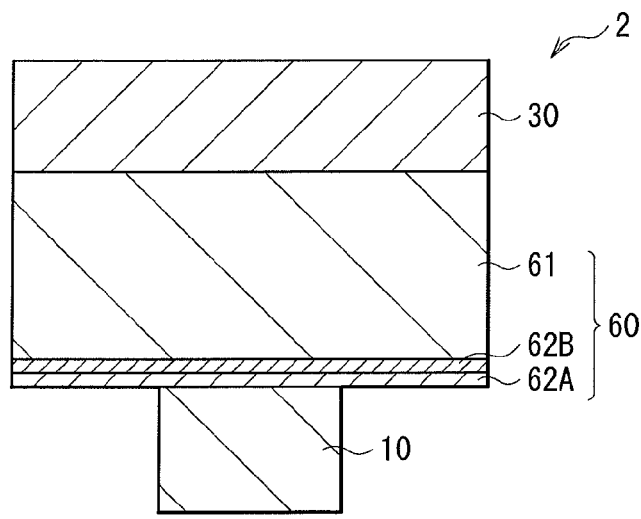
FIG. 4 is a cross-sectional view of a memory element in a modification of the present disclosure, showing the configuration thereof.

Described next is a memory element 2 in a modification of the embodiment described above. FIG. 4 is a cross-sectional view of the memory element 2, showing the configuration thereof. Although the memory element 2 is now described, any structure component similar to that in the embodiment above is provided with the same reference numeral, and is not described again. This memory element 2 is configured to include the lower electrode 10 (first electrode), a memory layer 60, and the upper electrode 30 (second electrode) in this order.

The memory layer 60 includes an ion source layer 61, and a resistance change layer 62. The ion source layer 61 has the composition same as that of the ion source layer 21 described above, and the resistance change layer 62 is in the structure including first and second resistance change layers 62A and 62B disposed one on the other in order from the lower electrode 10 side.

The first and second resistance change layers 62A and 62B each serve as a barrier against electric conduction similarly to the resistance change layer 22 in the embodiment described above, and each have different composition. As such, the resulting memory element 2 is prevented from varying in resistance value from those of others in the initial state or in the state of erasing, and is capable of keeping the resistance value at the time of writing and erasing even if the operation of writing and erasing is performed for a plurality of times.

Such a first resistance change layer 62A is preferably configured by an oxide or nitride containing at least one of rare-earth elements in a group consisting of yttrium (Y), lanthanum (La), neodymium (Nd), samarium (Sm), gadolinium (Gd), terbium (Tb), and dysprosium (Dy), or by an oxide or nitride containing at least an element in a group consisting of silicon (Si), aluminum (Al), titanium (Ti), zirconium (Zr), and hafnium (Hf). This is because the resulting film is to be relatively flat with an nm level.

Similarly to the resistance change layer 22 in the embodiment above, the second resistance change layer 62B is made of a compound mainly containing Te that behaves as an anionic component. Such a compound is exemplified by AlTe, MgTe, or ZnTe.

Alternatively, the first and second resistance change layers 62A and 62B may be configured by oxides or nitrides containing elements varying in physical properties, e.g., atomic weight, or atomic radius, or by oxides or nitrides varying in properties, i.e., with wettability different from that of the ion source layer 21. If this is the structure, the resulting complementary effect may be great.

To be specific, the first resistance change layer 62A may contain gadolinium oxide (GdOx), and the second resistance change layer 62B may contain a nitride of aluminum (Al) or silicon (Si) or an oxide thereof (aluminum oxide (AlOx) or silicon oxide (SiOx)).

If this is the case, since the first resistance change layer 62A containing gadolinium oxide (GdOx) contributes to the formation of a filament, the layer is thus preferably disposed to be in contact with the lower electrode 10. The second resistance change layer 62B made of a nitride or oxide of aluminum (Al) or silicon (Si) is disposed between the first resistance change layer 62A and the ion source layer 21. This accordingly produces a supplementary effect to any defect of the gadolinium oxide (GdOx) film by aluminum (Al) or silicon (Si) with a smaller atomic radius than that of gadolinium (Gd).

Alternatively, the first resistance change layer 62A is not necessarily made of gadolinium oxide (GdOx), but may be configured also by a material that possibly produces the low-resistance state by forming an impurity level by voltage bias with ions of a metallic element provided by the ion source layer 21, e.g., oxide or nitride of aluminum (Al) or silicon (Si). If this is the case, the effect similar to that described above is to be produced with the second resistance change layer 62B configured as above, i.e., having the physical properties (atomic weight or atomic radius) different from those of the first resistance change layer 62A, or having the properties such as wettability different from those of the ion source layer 21.

With the memory element 2 in the modification, the resistance change layer 62 is in the layered structure including the first and second resistance change layers 62A and 62B varying in composition. Accordingly, the following effect is produced in addition to the effect achieved in the embodiment described above. That is, by providing the first resistance change layer 62A made of an oxide on the lower electrode 10, the element characteristics are protected from degradation even with repeated operation of writing and erasing. Moreover, this eases the formation of an oxide or nitride film at the time of erasing, thereby favorably preventing insufficient insulation that is caused by excessive voltage application at the time of erasing. As such, the repetition characteristics are expected to be improved. What is more, this possibly widens the resistance range of a tellurium compound film available for use so that the selection range of materials for use is to be increased. In the below, specific examples according to the embodiment of the present disclosure are described.

Various samples were manufactured for the memory element 1 and the memory cell array in the embodiment described above, and their characteristics were examined.

(Experiment 1)
(Samples 1-1 to 1-61)

First of all, as shown in FIGS. 2 and 3, a MOS transistor Tr was formed on a semiconductor substrate 11. Next, an insulation layer was so formed as to cover the surface of the semiconductor substrate 11, and a via hole was formed in the insulation layer. Thereafter, by CVD (Chemical Vapor Deposition), the via hole was filled therein with an electrode material made of W (tungsten), and the surface of the resulting via hole was made flat by CMP (Chemical Mechanical Polishing). Thereafter, by repeating such processes, a plug layer 15, a metallic wiring layer 16, a plug layer 17, and the lower electrode 10 were formed, and then the lower electrode 10 was subjected to patterning on the memory cell basis.

Next, the memory layers 20 and 60, and the upper electrode 30 were formed on the lower electrode 10 using a device for sputtering. The diameter of the electrode was 50 to 300 nmφ. A film of alloy was formed at the same time using the target of a component element. Thereafter, the upper electrode 30 was subjected to etching on the surface, thereby forming a wiring layer (Al layer) with the thickness of 200 nm for a connection to a contact portion where an external circuit was connected for provision of an intermediate potential (Vdd/2). Thereafter, as a post-annealing process, in a furnace for a vacuum heat treatment, the resulting structure was subjected to a heat treatment for two hours at the temperature of 200° C. In this manner, the memory cell arrays shown in FIGS. 2 and 3 were manufactured, and were used as Samples 1-1 to 1-61.

In samples 1-1 to 1-61, the composition and the film thickness of "lower electrode/resistance change layer/ion source layer/upper electrode" were "TiN/Al1Te9 (3.5 nm)/ion source layer (50 nm)/W (50 nm)". The composition and the film thickness were fixed for the lower electrode 10, the resistance change layer 22, and the upper electrode 30, but the composition of the ion source layer 21 was varied. Tables 1 and 2 are each a list of the composition of the ion source layer 21 in Samples 1-1 to 1-61. Note that the composition of the ion source layer 21 in Tables 1 and 2 is that used at the time of manufacturing. As for the actual composition of the ion source layer 21 and that of the resistance change layer 21, by a heat treatment performed in the manufacturing processes, movable ions such as Cu, Zr, or Al in the ion source layer 21 were diffused in the resistance change layer 62.

TABLE 1

| Sample No. | Al(%) | Te(%) | Cu(%) | Zr(%) | Ge(%) | Retention | Repetition |
|---|---|---|---|---|---|---|---|
| Sample 1-1 | 12.7 | 31.9 | 27.7 | 27.7 | 6 | no good | no good |
| Sample 1-2 | 12.8 | 39.8 | 23.7 | 23.7 | 7 | good | no good |
| Sample 1-3 | 17.0 | 32.0 | 25.5 | 25.5 | 6 | no good | good |
| Sample 1-4 | 21.3 | 31.9 | 23.4 | 23.4 | 6 | good | no good |
| Sample 1-5 | 21.4 | 39.8 | 19.4 | 19.4 | 7 | no good | good |
| Sample 1-6 | 21.8 | 47.8 | 15.2 | 15.2 | 8 | no good | no good |
| Sample 1-7 | 24.8 | 43.8 | 15.7 | 15.7 | 7.5 | good | no good |
| Sample 1-8 | 25.1 | 24.7 | 25.1 | 25.1 | 4.5 | good | no good |
| Sample 1-9 | 27.7 | 34.1 | 19.1 | 19.1 | 6 | good | good |
| Sample 1-10 | 27.7 | 42.7 | 14.8 | 14.8 | 0 | good | good |
| Sample 1-11 | 28.4 | 28.4 | 21.6 | 21.6 | 5 | good | no good |

TABLE 1-continued

| Sample No. | Al(%) | Te(%) | Cu(%) | Zr(%) | Ge(%) | Retention | Repetition |
|---|---|---|---|---|---|---|---|
| Sample 1-12 | 28.7 | 31.9 | 19.7 | 19.7 | 6 | good | good |
| Sample 1-13 | 28.7 | 36.1 | 17.6 | 17.6 | 6 | good | good |
| Sample 1-14 | 29.0 | 39.8 | 15.6 | 15.6 | 7 | good | good |
| Sample 1-15 | 29.2 | 43.8 | 13.5 | 13.5 | 7.5 | good | no good |
| Sample 1-16 | 30.1 | 44.5 | 12.7 | 12.7 | 0 | good | no good |
| Sample 1-17 | 30.3 | 45.7 | 12.0 | 12.0 | 8 | good | no good |
| Sample 1-18 | 31.2 | 29.8 | 19.5 | 19.5 | 5.3 | good | good |
| Sample 1-19 | 31.8 | 39.2 | 14.5 | 14.5 | 7 | good | good |
| Sample 1-20 | 32.6 | 41.6 | 12.9 | 12.9 | 0 | good | good |
| Sample 1-21 | 33.6 | 27.4 | 19.5 | 19.5 | 5 | good | good |
| Sample 1-22 | 33.9 | 29.1 | 18.5 | 18.5 | 5.5 | good | good |
| Sample 1-23 | 33.9 | 31.1 | 17.5 | 17.5 | 5.5 | good | good |
| Sample 1-24 | 34.0 | 35.2 | 15.4 | 15.4 | 6 | good | good |
| Sample 1-25 | 34.1 | 36.9 | 14.4 | 14.4 | 6.5 | good | good |
| Sample 1-26 | 34.4 | 38.8 | 13.4 | 13.4 | 7 | good | good |
| Sample 1-27 | 34.6 | 42.6 | 11.4 | 11.4 | 7.5 | good | no good |
| Sample 1-28 | 34.8 | 46.8 | 9.2 | 9.2 | 8 | no good | no good |
| Sample 1-29 | 34.8 | 38.6 | 13.3 | 13.3 | 0 | good | good |
| Sample 1-30 | 35.1 | 30.5 | 20.5 | 13.9 | 15 | good | good |
| Sample 1-31 | 35.4 | 40.6 | 12.0 | 12.0 | 0 | good | good |

TABLE 2

| Sample No. | Al(%) | Te(%) | Cu(%) | Zr(%) | Ge(%) | Retention | Repetition |
|---|---|---|---|---|---|---|---|
| Sample 1-32 | 36.2 | 36.2 | 13.8 | 13.8 | 6 | good | good |
| Sample 1-33 | 36.6 | 32.2 | 15.6 | 15.6 | 5.7 | good | good |
| Sample 1-34 | 36.9 | 37.9 | 12.6 | 12.6 | 6.5 | good | good |
| Sample 1-35 | 37.0 | 35.6 | 13.7 | 13.7 | 0 | good | good |
| Sample 1-36 | 37.6 | 40.8 | 10.8 | 10.8 | 7 | good | no good |
| Sample 1-37 | 37.7 | 30.7 | 18.8 | 12.8 | 7.5 | good | good |
| Sample 1-38 | 38.7 | 25.7 | 17.8 | 17.8 | 4.5 | good | good |
| Sample 1-39 | 38.7 | 28.8 | 19.4 | 13.1 | 4.5 | good | good |
| Sample 1-40 | 38.9 | 29.5 | 15.8 | 15.8 | 5 | good | good |
| Sample 1-41 | 39.4 | 33.0 | 13.8 | 13.8 | 6 | good | good |
| Sample 1-42 | 39.6 | 36.8 | 11.8 | 11.8 | 6.5 | good | good |
| Sample 1-43 | 40.7 | 32.3 | 13.5 | 13.5 | 5.5 | good | good |
| Sample 1-44 | 41.1 | 30.5 | 14.2 | 14.2 | 5 | good | good |
| Sample 1-45 | 41.1 | 24.5 | 20.5 | 13.9 | 15 | good | good |
| Sample 1-46 | 41.4 | 25.0 | 16.8 | 16.8 | 4.5 | good | good |
| Sample 1-47 | 42.1 | 27.3 | 15.3 | 15.3 | 5 | good | good |
| Sample 1-48 | 43.8 | 20.7 | 17.7 | 17.7 | 4 | good | good |
| Sample 1-49 | 44.2 | 24.2 | 15.8 | 15.8 | 5 | good | good |
| Sample 1-50 | 44.2 | 27.4 | 14.2 | 14.2 | 5 | good | good |
| Sample 1-51 | 44.2 | 28.8 | 13.5 | 13.5 | 5 | good | good |
| Sample 1-52 | 44.2 | 30.6 | 10.5 | 14.7 | 5 | good | good |
| Sample 1-53 | 44.2 | 30.6 | 12.6 | 12.6 | 5 | good | good |
| Sample 1-54 | 44.2 | 30.6 | 13.8 | 11.6 | 5 | good | good |
| Sample 1-55 | 44.2 | 30.6 | 14.7 | 10.5 | 5 | good | good |
| Sample 1-56 | 44.2 | 30.6 | 15.7 | 9.5 | 5 | good | good |
| Sample 1-57 | 46.3 | 27.3 | 13.2 | 13.2 | 5 | good | good |
| Sample 1-58 | 47.4 | 24.2 | 14.2 | 14.2 | 5 | good | good |
| Sample 1-59 | 49.5 | 27.3 | 11.6 | 11.6 | 5 | no good | good |
| Sample 1-60 | 49.5 | 30.5 | 10.0 | 10.0 | 5 | no good | good |
| Sample 1-61 | 51.5 | 18.7 | 14.9 | 14.9 | 3 | no good | no good |

(Assessment of Characteristics)

Samples 1-1 to 1-61 were each assessed in terms of the characteristics of data retention and those of repetition. First of all, an operation of writing was performed with the writing/erasing pulse width of 10 ns/10 ns, a current at the time of recording of 130 μA, and a voltage for recording of 3.0 V. Thereafter, an operation of erasing was performed by varying a current at the time of erasing from 55 μA to 135 μA, and by varying a voltage at the time of erasing from 0.45 V to 1.1 V. Such operations were performed repeatedly for $10^5$ times under various conditions to 20 elements in total in 10 elements×2 rows in the memory cell array. For one of the two rows of elements, the operations were stopped in the state of writing, and for the remaining row, the operations were stopped in the state of erasing, thereby measuring the resistance value in each state of writing and erasing. Thereafter, the resistance value in each state of writing and erasing was measured again this time after a high-temperature accelerated retention test performed at 130° C. for an hour. In such a manner, the samples 1-1 to 1-61 were each assessed in terms of their characteristics of data retention.

The operations of writing and erasing were repeatedly performed for $10^6$ times under the following conditions, and the resistance value in each state of writing and erasing was measured. Under Condition 1, the resistance values were checked for any change in the states of writing and erasing at a low current. Under Condition 2, the resistance values were checked for any change in the states of writing and erasing at a high current. About specific conditions, Condition 1 includes, as common conditions, a current at the time of recording of 7.5 µA, a recording voltage of 3.0 V, and a writing/erasing pulse width of 10 ns/10 ns, and the operation of erasing was performed under the following three conditions. The erasing current and voltage during the operation of erasing were respectively 114 µA and 0.70 V under Condition (1-1), 112 µA and 0.65 V under Condition (1-2), and 110 µA and 0.60 V under Condition (1-3). Condition 2 includes, as common conditions, a current at the time of recording of 135 µA, a recording voltage of 3.0 V, and a writing/erasing pulse width of 10 ns/10 ns, and the operation of erasing was performed under the following three conditions, i.e., the erasing current and voltage during the operation of erasing were 200 µA and 0.80 V under Condition (2-1), 190 µA and 0.75 V under Condition (2-2), and 180 µA and 0.70 V under Condition (2-3).

Figure 8A:
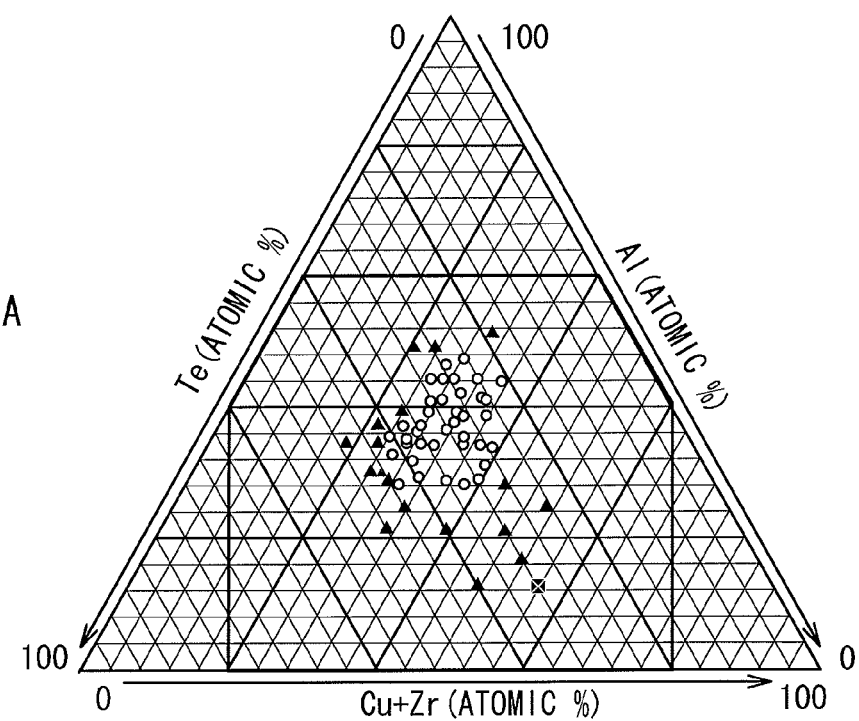
FIGS. 8A and 8B are each a ternary composition diagram showing the composition of elements in an ion source layer in Example 1.
Figure 8B:
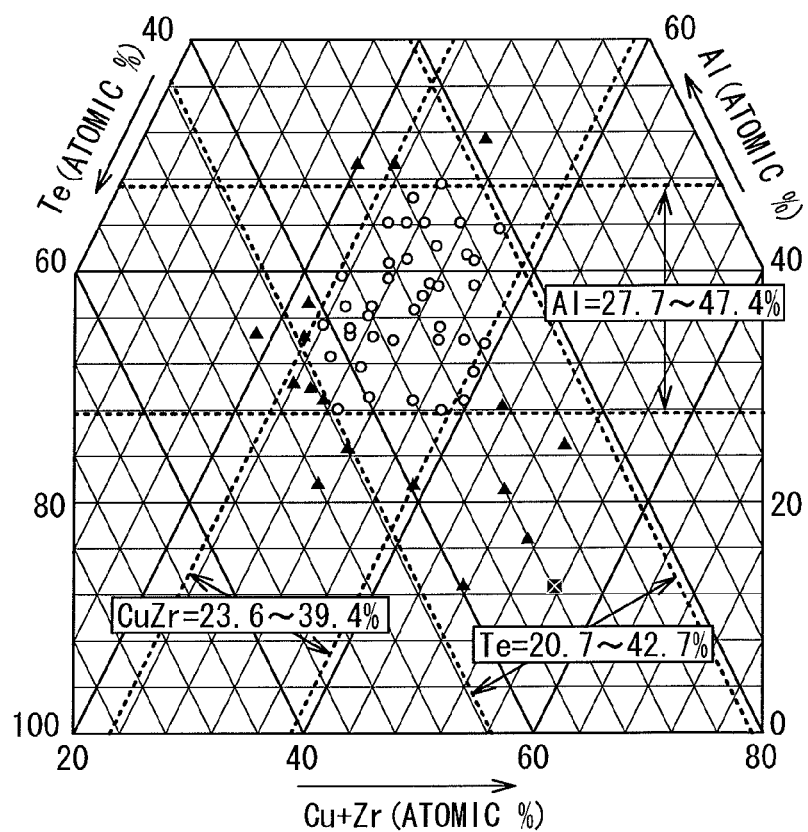

Tables 1 and 2 each show "good" or "no good" in terms of the characteristics of data retention and those of repetition for each of Samples 1-1 to 1-61 together with the list of composition of the ion source layer. FIGS. 5A to 7D each show a part of characteristics diagram showing the characteristics of data retention and those of repetition. Note that, in the characteristics diagram showing the characteristics of repetition, the upper part indicates the characteristics under Conditions (1-1) and (2-1), the middle part indicates those under Conditions (1-2) and (2-2), and the lower part indicates those under Conditions (1-3) and (2-3). Moreover, FIGS. 8A and 8B show the assessment results as such as a ternary composition diagram of Al, Cu+Zr, and Te. FIG. 8A shows the composition diagram in its entirety, and FIG. 8B shows the enlarged view of the portion of FIG. 8A enclosed by a solid line. In the drawing, hollow circles indicate the samples satisfying both the characteristics of data retention and those of repetition. These results show that the ion source layers 21 and 61 satisfying both the characteristics of data retention and those of repetition have the composition of aluminum (Al) in a range of 27.7 to 47.7 atomic %, copper (Cu) and zirconium (Zr) in total, i.e., (Cu+Zr), in a range of 23.6 to 39.4 atomic %, and tellurium (Te) in a range of 20.7 to 42.7 atomic %. Note that the ternary composition diagrams of FIGS. 8A and 8B each show the content ratio of not including germanium (Ge), but as shown in Tables 1 and 2, the content of Ge is preferably 15 atomic % or less.

(Experiment 2)

Memory cell arrays in which the composition of the resistance change layer 22 was different from those in Samples 1-1 to 1-61 were manufactured, and were used as Samples 2-1 to 2-4. Using these Samples 2-1 to 2-4, the characteristics of data retention and those of repetition were each assessed under conditions similar to those in Experiment 1. In samples 2-1 to 2-4, the composition and the film thickness of "lower electrode/resistance change layer/ion source layer/upper electrode" were "TiN/AlxTe10-x (3.5 nm)/ion source layer (50 nm)/W (50 nm)". Table 3 is a list of the composition and the assessment results of the resistance change layer 22 and those of the ion source layer 21 in Samples 2-1 to 2-4. FIGS. 9A and 9D are each a characteristics diagram showing the characteristics of data retention and those of repetition in each of Samples 2-1 to 2-4.

TABLE 3

| Sample No. | Resistance Change Layer | Al(%) | Te(%) | Cu(%) | Zr(%) | Ge(%) | Retention | Repetition |
|---|---|---|---|---|---|---|---|---|
| Sample 2-1 | Te | 36.2 | 36.2 | 13.8 | 13.8 | 6 | good | good |
| Sample 2-2 | Te | 36.6 | 32.2 | 15.6 | 15.6 | 5.7 | good | good |
| Sample 2-3 | Al30Te70 | 36.9 | 37.9 | 12.6 | 12.6 | 6.5 | good | good |
| Sample 2-4 | Al30Te70 | 37.0 | 35.6 | 13.7 | 13.7 | 0 | good | good |

These results show that, even if the resistance change layer 22 varies in composition ratio of Al and Te therein, as long as the composition in the ion source layer 21, i.e., the composition of Al, Zr, Cu, Ge, and Te (chalcogen element), falls within the range described above, the resulting characteristics of data retention and those of repetition are to be satisfactory.

(Experiment 3)

Figure 12:
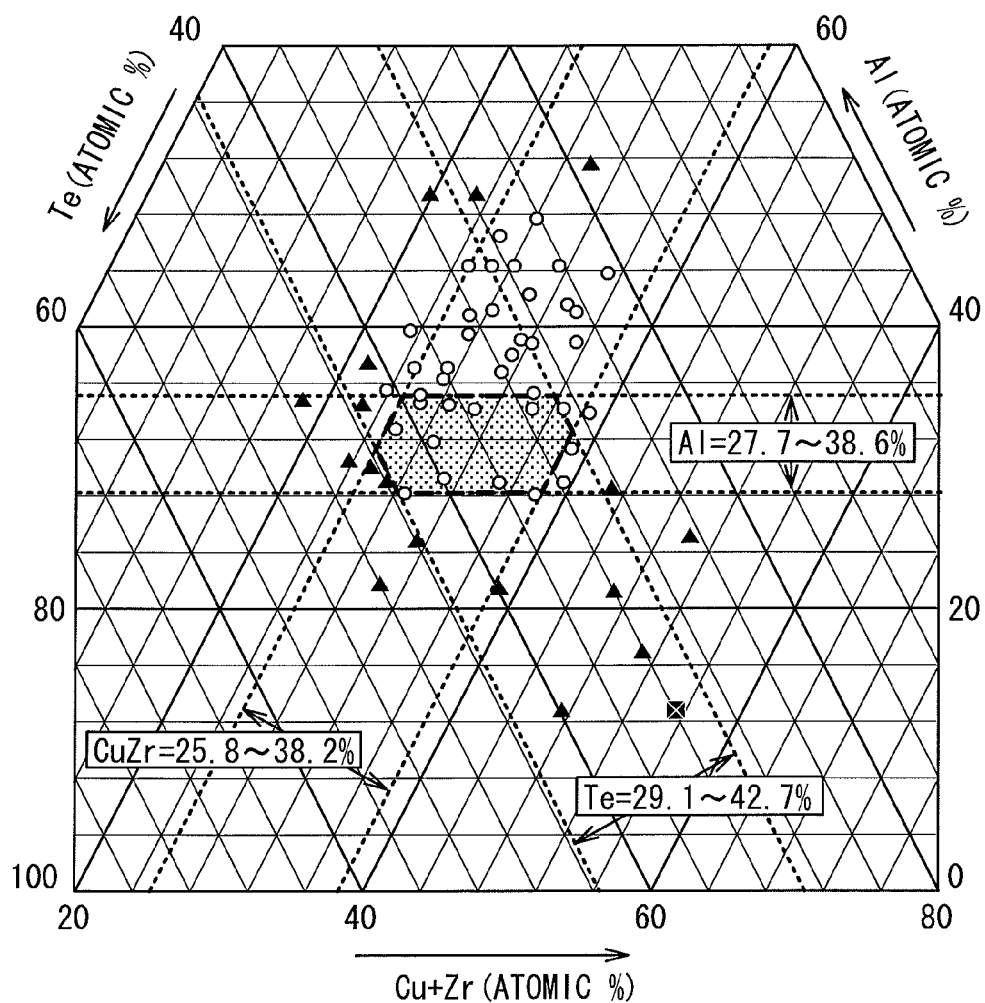
FIG. 12 is a ternary composition diagram showing the composition of elements in an ion source layer in Example 3.

Next, in any of Samples 1-1 to 1-61 showing the satisfactory characteristics of data retention and those of repetition, their characteristics of data retention were assessed under lower-current conditions, more specifically, under conditions of a current at the time of recording of 7 µA to 50 µA, a recording voltage of 3.0 V, and a recording pulse width of 1 nsec to 100 msec using 100 pieces of elements. Table 4 shows "good" and "no good" in terms of the composition of the ion source layer and that of the characteristics of data retention for each of Samples 1-9, 1-20, 1-21, 1-28, 1-30, 1-58, 1-60, and 1-61. FIGS. 10A to 11C are each a characteristics diagram showing the characteristics of data retention. Moreover, FIG. 12 shows the assessment results of the characteristics of data retention under the lower-current conditions as a ternary composition diagram of Al, Cu+Zr, and Te.

TABLE 4

| Sample No. | Al(%) | Te(%) | Cu(%) | Zr(%) | Ge(%) | Retention |
|---|---|---|---|---|---|---|
| Sample 1-9 | 27.7 | 34.1 | 19.1 | 19.1 | 6 | good |
| Sample 1-11 | 28.4 | 28.4 | 21.6 | 21.6 | 5 | good |
| Sample 1-20 | 32.6 | 41.6 | 12.9 | 12.9 | 0 | good |
| Sample 1-21 | 33.6 | 27.4 | 19.5 | 19.5 | 5 | good |
| Sample 1-28 | 34.8 | 46.8 | 9.2 | 9.2 | 8 | no good |
| Sample 1-30 | 35.1 | 30.5 | 20.5 | 13.9 | 15 | good |
| Sample 1-58 | 47.4 | 24.2 | 14.2 | 14.2 | 5 | good |
| Sample 1-60 | 49.5 | 30.5 | 10.0 | 10.0 | 5 | no good |
| Sample 1-61 | 49.5 | 30.5 | 10.0 | 10.0 | 5 | no good |

These results show the composition of the ion source layer 21 that may keep satisfactory the characteristics of data retention thereof even at a lower current, i.e., aluminum (Al) in a range of 27.7 to 38.6 atomic %, copper (Cu) and zirconium (Zr) in total, i.e., (Cu+Zr) in a range of 25.8 to 38.2 atomic %, tellurium (Te) in a range of 29.1 to 42.7 atomic %, and germanium (Ge) of 15 atomic % or less. These results also show that, in the composition range of Experiment 1, the composition-ratio range advantageous for the low-current operation is in a region where the composition ratio of Al is low.

(Experiment 4)

Memory cell arrays were manufactured using the memory element 1 in which the resistance change layer 22 contains oxygen, and were used as Samples 3-1 and 3-2. Table 5 is a list of the composition of the resistance change layer 22 and that of the ion source layer 21, and the assessment results about the characteristics of data retention and those of repetition measured under the conditions similar to those in Experiment 1. FIGS. 13A and 13B are each a characteristics diagram showing the characteristics of data retention and those of repetition.

TABLE 5

| Sample No. | Resistance Change Layer | Al(%) | Te(%) | Cu(%) | Zr(%) | Ge(%) | Retention | Repetition |
|---|---|---|---|---|---|---|---|---|
| Sample 3-1 | [Al40Te60]-0 | 39.4 | 33.0 | 13.8 | 13.8 | 6 | good | good |
| Sample 3-2 | Te-0 | 34.4 | 38.8 | 13.4 | 13.4 | 7 | good | good |

These results show that, as long as the composition of the ion source layers 21 and 61, i.e., the composition of Al, Zr, Cu, Ge, and Te (chalcogen element), falls within the range described above, even if the resistance change layer 22 contains oxygen, the resulting characteristics of data retention and those of repetition are to be satisfactory.

(Experiment 5)

In the below, memory cell arrays were manufactured using the memory element 2 in the modification, i.e., the memory element 2 including the first and second resistance change layers 62A and 62B, and were used as Samples 4-1 to 4-3. In samples 4-1 to 4-3, the composition and the film thickness of "lower electrode/first resistance change layer/second resistance change layer/ion source layer/upper electrode" were "TiN/first resistance change layer/second resistance change layer/ion source layer (50 nm)/W (50 nm)". Table 6 is a list of the composition and the film thickness of the first resistance change layer 62A and those of the second resistance change layer 62B, and the composition and the assessment results of the ion source layer 61. FIGS. 14A to 14C are each a characteristics diagram showing the characteristics of data retention and those of repetition in each of Samples 4-1 to 4-3.

TABLE 6

| Sample No. | First/Second Resistance Change Layer | Al(%) | Te(%) | Cu(%) | Zr(%) | Ge(%) | Retention | Repetition |
|---|---|---|---|---|---|---|---|---|
| Sample 4-1 | ZrN(0.3)-0x/Te(4.5) | 41.4 | 25.1 | 16.8 | 16.8 | 4.5 | good | good |
| Sample 4-2 | Ti(0.15)-0x/Al1Te9(3.3) | 34.0 | 31.2 | 17.4 | 17.4 | 5.5 | good | good |
| Sample 4-3 | Al-0(1.0)/AlTe9(3.3) | 34.0 | 31.2 | 17.4 | 17.4 | 5.5 | good | good |

These results show that, even if the resistance change layer is plurally disposed one on the other, as long as the composition of the ion source layer 61, i.e., the composition of Al, Zr, Cu, Ge, and Te (chalcogen element), falls within the range described above, the resulting characteristics of data retention and repetition are to be satisfactory.

While the present disclosure has been described in detail by referring to the embodiment, the modification, and Examples, the present disclosure is not restrictive to the embodiment and others described above, and it is understood that numerous other modifications may be possibly devised.

For example, in the embodiment and others described above, the configurations of the memory elements 1 and 2, and that of the memory cell array are specifically described. However, all of the layers are not necessarily provided, or any other layers may be also provided.

Moreover, for example, the materials of the layers, the film-forming methods and conditions, and others described in the embodiment and others above are surely not restrictive, and any other materials, or any other film-forming methods will also do. For example, the ion source layers 21 and 61 may be each added with any other types of transition metallic element such as Ti, Hf, V, Nb, Ta, Cr, Mo, or W as long as the composition ratio described above remains the same, and Cu, Ag, and Zn are surely not restrictive, and nickel (Ni) may be added.

The present disclosure contains subject matter related to that disclosed in Japanese Priority Patent Application JP 2011-48376 filed in the Japan Patent Office on Mar. 4, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A memory element comprising a first electrode, a memory layer, and a second electrode, in this order, wherein the memory layer includes:

a resistance change layer at a first electrode side of the memory layer, the resistance change layer having a single-layer or a multi-layer structure including a layer containing a highest percentage of tellurium (Te) as an anionic component, and an ion source layer at a second electrode side of the memory layer, the ion source layer containing aluminum (Al) and one or more chalcogen elements including tellurium (Te), sulfur (S) or selenium (Se), the aluminum being present in the amount of 27.7 atomic % or more but 47.4 atomic % or less, the ion source layer also containing copper (Cu) and zirconium (Zr), a content of the copper and zirconium in the ion source layer being 23.6 atomic % or more but 39.4 atomic % or less.

2. The memory device of claim 1, wherein the ion source layer further includes Ge Ti, Zr, Hf, V, Nb, Ta, Cr, Mo or W or any combination of them.

3. A memory element comprising a first electrode, a memory layer, and a second electrode, in this order, wherein the memory layer includes:

a resistance change layer at a first electrode side of the memory layer, the resistance change layer having a single-layer or a multi-layer structure including a layer containing a highest percentage of tellurium (Te) as an anionic component, and an ion source layer at a second electrode side of the memory layer, the ion source layer containing aluminum (Al) and one or more chalcogen elements including tellurium (Te), sulfur (S) or selenium (Se), the aluminum being present in the amount of 27.7 atomic % or more but 47.4 atomic % or less, the ion source layer also including germanium (Ge) in an amount of 15 atomic % or less.

4. The memory device of claim 3, wherein the ion source layer further includes Cu, Zr, Ti, Zr, Hf, V, Nb, Ta, Cr, Mo or W or any combination of them.

5. The memory element according to claim 1 or 3, wherein in the ion source layer, a content of the chalcogen element is 20.7 atomic % or more but 42.7 atomic % or less.

6. The memory element according to claim 1 or 3, wherein a change of resistance value occurs by formation of a low-resistance section including the aluminum in the resistance change layer in response to application of a voltage to the first and second electrodes.

7. A memory element comprising a first electrode, a memory layer, and a second electrode, in this order, wherein:
(a) the memory layer includes
  (1) a resistance change layer at a first electrode side of the memory layer, the resistance change layer having a single-layer or a multi-layer structure including a layer containing a highest percentage of tellurium (Te) as an anionic component, and
  (2) an ion source layer at a second electrode side of the memory layer, the ion source layer containing aluminum and one or more chalcogen elements including tellurium (Te), sulfur (S) or selenium (Se); and
(b) the ion source layer contains Al, Cu, Zr, and Ge in the amounts of 27.7 atomic %≤Al≤38.6 atomic %, 25.8 atomic %≤Cu+Zr≤38.2 atomic %, 29.1 atomic %≤chalcogen element≤42.7 atomic %, and Ge≤15 atomic %.

8. A memory device, comprising:
a plurality of memory elements each including a first electrode, a memory layer, and a second electrode, in this order; and
a pulse application unit that selectively applies a voltage or current pulse to the memory elements,
wherein each memory layer includes
  (1) a resistance change layer at a first electrode side of the memory layer, the resistance change layer having a single-layer or a multi-layer structure including a layer containing a highest percentage of tellurium (Te) as an anionic component, and
  (2) an ion source layer at a second electrode side of the memory layer, the ion source layer containing aluminum (Al) lement and one or more chalcogen elements including tellurium (Te), sulfur (S or selenium (Se), the aluminum (Al) content being 27.7 atomic % or more but 47.4 atomic % or less, the ion source layer also containing copper (Cu) and zirconium (Zr), and a content of the copper and zirconium in the ion source layer is 23.6 atomic % or more but 39.4 atomic % or less.

9. A memory device, comprising:
a plurality of memory elements each including a first electrode, a memory layer, and a second electrode, in this order; and
a pulse application unit that selectively applies a voltage or current pulse to the memory elements,
wherein each memory layer includes
  (1) a resistance change layer at a first electrode side of the memory layer, the resistance change layer having a single-layer or a multi-layer structure including a layer containing a highest percentage of tellurium (Te) as an anionic component, and
  (2) an ion source layer at a second electrode side of the memory layer, the ion source layer containing aluminum (Al) lement and one or more chalcogen elements including tellurium (Te), sulfur (S or selenium (Se), the aluminum (Al) content being 27.7 atomic % or more but 47.4 atomic % or less, the ion source layer also including germanium (Ge) in the amount of 15 atomic % or less.

10. The memory device according to claim 8 or 9, wherein in the ion source layer, a content of the chalcogen element is 20.7 atomic % or more but 42.7 atomic % or less.

11. A memory device, comprising:
a plurality of memory elements each including a first electrode, a memory layer, and a second electrode, in this order; and
a pulse application unit that selectively applies a voltage or current pulse to the memory elements,
wherein,
  (a) each memory layer includes
    (1) a resistance change layer at a first electrode side of the memory layer, the resistance change layer having a single-layer or a multi-layer structure including a layer containing a highest percentage of tellurium (Te) as an anionic component, and
    (2) an ion source layer at a second electrode side of the memory layer, the ion source layer containing one or more chalcogen elements including tellurium (Te), sulfur (S), or selenium (Se); and
  (b) each ion source layer contains Al, Cu, Zr, and Ge in the amounts of 27.7 atomic %≤Al≤38.6 atomic %, 25.8 atomic %≤Cu+Zr≤38.2 atomic %, 29.1 atomic %≤chalcogen element≤42.7 atomic %, and Ge≤15 atomic %.

* * * * *